United States Patent
Takigawa et al.

(10) Patent No.: US 10,990,089 B2
(45) Date of Patent: Apr. 27, 2021

(54) MACHINE LEARNING DEVICE LEARNING FAILURE OCCURRENCE MECHANISM OF LASER DEVICE

(71) Applicant: Fanuc Corporation, Yamanashi (JP)

(72) Inventors: Hiroshi Takigawa, Yamanashi (JP); Tetsuhisa Takazane, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 281 days.

(21) Appl. No.: 16/257,795

(22) Filed: Jan. 25, 2019

(65) Prior Publication Data
US 2019/0235481 A1 Aug. 1, 2019

(30) Foreign Application Priority Data

Jan. 30, 2018 (JP) .............................. JP2018-014132

(51) Int. Cl.
*G05B 23/02* (2006.01)
*G06N 20/00* (2019.01)
(Continued)

(52) U.S. Cl.
CPC ....... *G05B 23/024* (2013.01); *G05B 23/0243* (2013.01); *G05B 23/0281* (2013.01); *G05B 23/0283* (2013.01); *G06N 20/00* (2019.01); *H01S 3/00* (2013.01); *H01S 5/0683* (2013.01); *G05B 2219/33198* (2013.01); *G05B 2219/36199* (2013.01)

(58) Field of Classification Search
CPC .............. G05B 23/024; G05B 23/0243; G05B 23/0281; G05B 23/0283; G05B 2219/33198; G05B 2219/36199; G06N 20/00; H01S 3/00; H01S 5/0683
USPC ........................................................ 702/183
See application file for complete search history.

(56) References Cited

U.S. PATENT DOCUMENTS

| | | | |
|---|---|---|---|
| 2006/0159140 A1* | 7/2006 | Machida ............... | H01S 3/0602 372/33 |
| 2015/0160098 A1 | 6/2015 | Node et al. | |

(Continued)

FOREIGN PATENT DOCUMENTS

| | | | |
|---|---|---|---|
| JP | 2015-88079 A | | 5/2015 |
| JP | 2015151880 A | * | 8/2015 |

(Continued)

*Primary Examiner* — Mischita L Henson
*Assistant Examiner* — Aeysha N Sultana
(74) *Attorney, Agent, or Firm* — RatnerPrestia

(57) ABSTRACT

A machine learning device observes a state variable of the inside and the outside of a laser device including time-series data of light output, which is detected by an output light sensor, and a light output command through a control unit of the laser device, and acquires a determination result on correctness with respect to a quantitative failure occurrence mechanism outputted for each failure in the laser device. The machine learning device learns the quantitative failure occurrence mechanism corresponding to each failure while associating the quantitative failure occurrence mechanism with the state variable and the determination result on correctness with respect to the quantitative failure occurrence mechanism, and decides a quantitative failure occurrence mechanism which is to be outputted when an occurrence of each failure is detected.

15 Claims, 16 Drawing Sheets

(51) Int. Cl.
　　　*H01S 5/0683*　　　(2006.01)
　　　*H01S 3/00*　　　　(2006.01)

(56)　　　　References Cited

U.S. PATENT DOCUMENTS

| 2017/0028562 A1* | 2/2017 | Yamazaki | B25J 9/1697 |
| 2017/0028593 A1 | 2/2017 | Maruyama | |
| 2020/0293021 A1* | 9/2020 | Goya | G05B 19/4069 |

FOREIGN PATENT DOCUMENTS

| JP | 2017-30221 A | 2/2017 |
| JP | 2017-033526 A | 2/2017 |

* cited by examiner

FIG. 15

| SCORE | OCCURRENCE FREQUENCY | FAILURE OCCURRENCE MECHANISM (OUTLINE) | FAILED SPOT | IMPROVEMENT ITEMS |
|---|---|---|---|---|
| 80 | 15% | REFLECTION LIGHT IS INCREASED BY CONTAMINATION OF PROTECTION WINDOW OF MACHINING HEAD AND SCATTERS AT FIBER FUSION POINT, AND TEMPERATURE OF CLAD SURFACE RISES, RESULTING IN BURNING OF PROTECTION SLEEVE | FIBER FUSION POINT | (1) ADD REFLECTION LIGHT SENSOR (2) IMPROVE HEAT RESISTANCE OF PROTECTION SLEEVE FOR FIBER |
| | | | | |
| | | | | |

MACHINE LEARNING DEVICE LEARNING FAILURE OCCURRENCE MECHANISM OF LASER DEVICE

CROSS-REFERENCE TO RELATED APPLICATION

This application is anew U.S. Patent Application that claims benefit of Japanese Patent Application No. 2018-014132 filed Jan. 30, 2018, the disclosure of this application is being incorporated herein by reference in its entirety for all purposes.

BACKGROUND OF THE INVENTION

1. Field of the Invention

The present invention relates to a machine learning device that learns quantitative failure occurrence mechanism in a high power laser device. The high power laser device performs laser machining by irradiating a workpiece, from a machining head through an optical fiber, with laser light which is emitted from a laser oscillator using many laser diode modules as light emitting sources or excitation light sources.

More specifically, for failure of a high power laser device that propagates laser light irradiated from a direct diode laser oscillator using many laser diode modules as light emitting sources or a fiber laser oscillator using many laser diode modules as excitation light sources, by mean of an optical fiber, the machine learning device of the present invention not only learns a cause of such failure occurrence and a condition of such failure occurrence, but also learn, based on the failure cause triggering the failure occurrence and the magnitude of the failure, a quantitative failure occurrence mechanism of the laser device which includes a series of causality reaching a failure state such as quantitative change of the state of the laser device caused by the failure cause, physical mechanism of occurrence of failure by the change of the state of the laser device, and the location of the failure caused by the physical mechanism and magnitude of the failure, using data acquired from the laser device connected through a network, and issues a command of a failure avoidance driving condition to the laser device by referring to a result of the learning. This machine learning device serves also as a preventive maintenance device which outputs remaining time up to occurrence of failure.

2. Description of the Related Art

There are wide variety of state variables of a laser device which are considered to be related to a failure occurrence cause and a failure occurrence condition of the laser device, such as driving conditions and driving states including hardware configuration, manufacturing information, and a history; outputs from a plurality of optical detection sensors and outputs from a temperature sensor and a humidity sensor of each component; and circumferential environmental conditions such as a temperature, humidity, vibration, altitude, and air cleanliness. On the other hand, since a failure does not occur so often, it is hard to obtain sufficient quantity of data.

As a result, there has been a problem that even though a failure occurrence cause and a failure occurrence condition are learned through machine learning in a manner to associate a result which is the failure state with state variables of a laser device obtained on the time point on which the failure occurs and before and after the failure occurrence, sufficient accuracy cannot be obtained or much time is required to collect large quantity of failure data and improve accuracy.

Though an object device is not a laser device, Japanese Patent Application Laid-Open No. 2017-030221, for example, discloses an apparatus for diagnosing abnormality of an injection molding machine, in which internal and external state data on the injection molding machine are inputted so as to diagnose abnormality of the injection molding machine by means of a machine learning apparatus. In this apparatus for diagnosing abnormality, internal parameters of the machine learning apparatus are obtained by performing machine learning based on the state data obtained when abnormality occurs and the state data obtained when abnormality does not occur. Further, the apparatus for diagnosing abnormality specifies a state variable causing abnormality among the state variables when predicting an occurrence of abnormality. However, though the apparatus for diagnosing abnormality specifies a state variable causing abnormality, the apparatus for diagnosing abnormality does not perform machine learning for quantitative failure occurrence mechanisms. Thus, Japanese Patent Application Laid-Open No. 2017-030221 does not make mention of physical evidence coupling an abnormality cause with an abnormality phenomenon, and as a result, Japanese Patent Application Laid-Open No. 2017-030221 does not show a solution to the problem that sufficient accuracy cannot be obtained even through machine learning due to presence of many state variables and few failure occurrence case examples and much time is required until large quantity of failure data are collected and accuracy is improved.

Further, Japanese Patent Application Laid-Open No. 2017-033526 discloses a machine learning device that learns a condition associated with a failure in an industrial machine. This machine learning device includes: a state observation unit for observing a state variable including at least one of output data of a sensor, which detects a state of the industrial machine or a circumferential environment, internal data of control software for controlling the industrial machine, and calculation data obtained on the basis of the output data or the internal data while the industrial machine is operating or stationary; a determination data acquisition unit for acquiring determination data in which the presence or the level of a failure in the industrial machine is determined; and a learning unit for learning a condition associated with a failure in the industrial machine in accordance with a training data set created on the basis of a combination of the state variable and the determination data.

However, according to Japanese Patent Application Laid-Open No. 2017-033526 mentioned above, the learning unit learns a condition associated with a failure, but the learning unit does not perform machine learning for quantitative failure occurrence mechanisms. Thus, Japanese Patent Application Laid-Open No. 2017-033526 does not make mention of physical evidence coupling an abnormality cause with an abnormality phenomenon, and Japanese Patent Application Laid-Open No. 2017-033526 does not show a solution to the problem that sufficient accuracy cannot be obtained even through machine learning due to presence of many state variables and few failure occurrence case examples and much time is required until large quantity of failure data are collected so that accuracy is improved.

Further, Japanese Patent Application Laid-Open No. 2015-088079 discloses a health management system that monitors of a health state of a machine plant. The health management system includes: a time-series data acquisition part for acquiring sensor data, which are acquired from a plurality of sensors installed in the machine plant, or the sensor data and environment data representing installation environment of the machine plant, as time series data; a state quantification part for quantifying a plant state of the machine plant and a health state, which represents performance of the machine plant or a state of quality, by a statistical method using normal data which is the time-series data acquired when the machine plant is in a normal state, as learning data; and an output part for displaying the quantified machine state and the quantified health state and/or outputting the quantified machine state and the quantified health state to the outside. However, though this health management system quantifies a health state of the machine plant by the statistical method using normal data as learning data, the health management system does not perform machine learning for quantitative failure occurrence mechanisms. Further, Japanese Patent Application Laid-Open No. 2015-088079 does not make mention of physical evidence coupling an abnormality cause with an abnormality phenomenon, and Japanese Patent Application Laid-Open No. 2015-088079 thus does not show a solution to the problem that sufficient accuracy cannot be obtained even through machine learning due to presence of many state variables and few failure occurrence case examples and much time is required until large quantity of failure data are collected so that accuracy is improved.

As described above, each of the patent documents makes mention of the technique for diagnosing abnormality and specifying an abnormality cause, for learning a condition associated with a failure, or for quantifying a health state of a machine plant, based on data representing a state of the machine in which abnormality or a failure occurs and data representing a state of a machine in which abnormality or a failure does not occur. However, any of those patent documents does not show a solution to the problem that sufficient accuracy cannot be obtained even through machine learning due to presence of many state variables and few failure occurrence case examples and much time is required until large quantity of failure data are collected so that accuracy is improved.

In a high power laser device, light with large amount of energy propagates in cores of thin fibers. Therefore, there are many failure modes such as a failure related to high-density optical energy, a failure related to an optical component in which high-density optical energy propagates, a failure related to a laser diode module and occurring due to use of a large number of high power laser diode modules, and a failure related to a power source which supplies high power to laser diode modules, other than a general mechanical failure mode in a mechanical device. State variables of a laser device which are considered to be related to a failure occurrence cause and a failure occurrence condition of the laser device include: data related to hardware configurations such as kinds and types of a laser diode module, an optical coupler (combiner), an amplification fiber, a delivery fiber, a machining head, a power source unit, and a sensor which are used in the machine; manufacturing information such as a lot number, a manufacturing condition, a manufacturing date, and a result in a shipping test of a component to be used; data related to driving conditions and driving states including a history representing a driving period and a driving condition; output data from many sensors such as a plurality of light detection sensors for detecting output light from a laser oscillator and reflection light from a workpiece and a laser optical system, a plurality of temperature sensors for each component such as a laser oscillator and a cooling unit for cooling the laser oscillator, and a humidity sensor for detecting humidity of air in the machine; circumferential environmental conditions such as a temperature, humidity, vibration, altitude, and air cleanliness; and the like.

As a result, when a failure occurs, it is hard for human beings to diagnose the failure and specify a cause of the failure while grasping all of the above-mentioned data and conditions and taking into account the influence of the data and the conditions. Accordingly, there are a problem in which restoration requires time because human beings do not find out the failed part, a problem in which a similar failure recurs because human beings cannot grasp a failure occurrence cause, and a problem in which a failure cannot be prevented because a failure occurrence condition is not known.

Machine learning is considered to be applied so as to grasp many conditions and data, diagnose a failure, specify a cause of the failure, and grasp a condition of failure occurrence while taking into account the influence of the conditions and the data, which are hard for human beings to perform. However, a failure does not occur so often, and it is not realistic to repeat limit characteristic test multiple times in which a high power laser device, which is expensive, is driven while increasing a load thereon until the high power laser device forcibly fails. Therefore, it is hard to obtain data which are related to failures and are required for machine learning in the first place.

Consequently, there has been the problem that even though a failure occurrence cause and a failure occurrence condition are learned through machine learning in a manner to associate a result which is a failure state with state variables of a laser device obtained on time point on which the failure occurs and before and after the failure occurrence, a learning result with sufficient accuracy cannot be obtained and much time is required to gather large quantity of failure data and improve learning accuracy, as described above.

SUMMARY OF THE INVENTION

An object of the present invention is to provide a machine learning device that is capable of learning a failure occurrence cause and a failure occurrence condition with high accuracy even based on a relatively small amount of failure data and performing precise preventive maintenance by using the learning result, with respect to a failure in a high power laser device which has many failure modes and of which a failure occurrence cause and a failure occurrence condition are hard to be grasped by conventional methods.

A machine learning device according to the present invention is a machine learning device that is connected with at least one laser device to be mutually communicable with the laser device via a network. The laser device includes: at least one laser oscillator; a power source unit that supplies driving current to the laser oscillator; at least one output light sensor that detects light output of laser light emitted from the laser oscillator; and a control unit that outputs at least a current output command corresponding to a light output command to the power source unit and receives a detection signal from the output light sensor. The machine learning device includes; a state observation unit that observes a state variable of an inside and an outside of the laser device, including time-series data of light output which is detected by the output light sensor and the light output command, through the control unit of the laser unit; a determination result acquisition unit that acquires a determination result on correctness with respect to a quantitative failure occurrence mechanism, which is outputted by the machine learning device for each failure in the laser device; a learning unit that receives output from the state observation unit and output from the determination result acquisition unit and learns the quantitative failure occurrence mechanism corresponding to the each failure while associating the quantitative failure occurrence mechanism with the state variable, which is observed by the state observation unit, of the laser device and the determination result, which is acquired by the determination result acquisition unit, on correctness with respect to the quantitative failure occurrence mechanism; and a decision making unit that refers to a learning result of the learning unit when an occurrence of the each failure is detected through at least collation between the time-series data of the light output and the light output command and decides the quantitative failure occurrence mechanism which is to be outputted from the machine learning device.

The machine learning device learns a sequential quantitative failure occurrence mechanism from a failure cause to a failure occurrence state for each of various types of failures by the above-mentioned configuration, and accordingly, the machine learning device can more securely perform more precise estimation consistent with a physical phenomenon and a physical mechanism compared to a learning method for estimating a failure cause and a failure occurrence condition through statistical processing of state variables, for example.

In the machine learning device, the state variable, which is observed by the state observation unit, of the laser device may include at least one of a hardware configuration including a machining head of the laser device, manufacturing information of the laser device or a unit and a component constituting the laser device, output data which represents a driving condition or a driving state of the laser device and is outputted from a sensor installed on the inside or the outside of the laser device, a history of the driving condition or the driving state, a repair history of the laser device, internal data of control software for controlling the laser device, and calculation data obtained based on the output data or the internal data. The output data may include at least one of light output from the laser device or the laser oscillator; intensity of reflection light which propagates inside a laser optical system including an optical fiber in an opposite direction to that of laser output light; driving current or driving power of a laser diode module which is an excitation light source of the laser oscillator; a temperature of the laser diode module or a part which is thermally connected with the laser diode module; a temperature of a heat sink for suppressing temperature rise of the laser diode module; a kind, a property, a temperature, a flow rate, and pressure of refrigerant for cooling down the heat sink; intensity of vibration, acceleration, and intensity of impact which are applied to the laser device; and a temperature, humidity, cleanness, oil mist concentration, and floating particle concentration of ambient air of the laser device.

The machine learning device can precisely learn quantitative failure occurrence mechanisms corresponding to various types of failures through observation of many state variables by the above-mentioned configuration.

The machine learning device may record at least one physical model, the physical model representing at least a part of a quantitative failure occurrence mechanism, the quantitative failure occurrence mechanism corresponding to each failure in the laser device and including a chain of physical causal relationships including a failure cause triggering failure occurrence and a level of the failure cause, a value or variation of a specific state variable in the state variable of the laser device, the value or variation being brought by the failure cause, a physical phenomenon or a physical mechanism in which a damage is generated with the value or the variation of the specific state variable, and a failure state representing a spot or a component which is damaged in the physical phenomenon or the physical mechanism and a state and a level of the damage, and perform at least one of estimation of the quantitative failure occurrence mechanism corresponding to the each failure and learning of the quantitative failure occurrence mechanism corresponding to the each failure by referring to the physical model.

The machine learning device can raise probability of success in estimating a physically-rational quantitative failure occurrence mechanism in relatively early stages, by referring to the physical model by the above-mentioned configuration.

In the machine learning device, determination of correctness of the quantitative failure occurrence mechanism outputted with respect to the each failure in the laser device may be performed based on presence of at least one accordance between presence of agreement between a failure occurrence state which is confirmed by an administrator, an operator, or a person in charge of repair of the laser device and a failure occurrence state included in the quantitative failure occurrence mechanism which is outputted, and presence of consistency, which is examined by referring to the physical model, between the confirmed failure occurrence state, and the physical phenomenon or the physical mechanism which is included in the quantitative failure occurrence mechanism which is outputted.

The machine learning device eliminates estimation which is inconsistent with the physical model by adding the determination on presence of consistency with a physical phenomenon or a physical mechanism to the determination of correctness, being able to learn rational quantitative failure occurrence mechanisms with respect to various types of failures, by the above-mentioned configuration.

In the machine learning device, the learning unit may have at least one learning model to which a learning result is reflected, and include an error calculation unit and a learning model update unit; when there is a difference between the failure occurrence state which is confirmed and the failure occurrence state which is included in the outputted quantitative failure occurrence mechanism, the learning unit may calculate a first error depending on a magnitude of the difference and update the learning model depending on the first error in the learning model update unit; when the failure occurrence state which is confirmed is inconsistent with the physical phenomenon or the physical mechanism included in the outputted quantitative failure occurrence mechanism in collation with the physical model, the learning unit may calculate a second error while considering that an error larger than the first error is generated; and the learning model update unit may update the learning model depending on the magnitude of the first or second error.

When a confirmed failure occurrence state is not only different from a failure occurrence state included in an outputted quantitative failure occurrence mechanism but also inconsistent with a physical phenomenon or a physical mechanism included in the outputted quantitative failure occurrence mechanism, the machine learning device determines that an error of a learning result of the quantitative failure occurrence mechanism for the failure is larger and updates the learning model, being able to learn rational quantitative failure occurrence mechanisms conforming to physical models with respect to each failure in various types of failures, by the above-mentioned configuration.

In the machine learning device, the learning unit may have at least one value function to which a learning result is reflected, and include an reward calculation unit and a value function update unit; when the failure occurrence state which is confirmed agrees with the failure occurrence state which is included in the outputted quantitative failure occurrence mechanism, the reward calculation unit may set a plus reward; when there is a difference between the failure occurrence state which is confirmed and the failure occurrence state which is included in the outputted quantitative failure occurrence mechanism, the reward calculation unit may set a first minus reward depending on a magnitude of the difference; when the failure occurrence state which is confirmed is inconsistent with the physical phenomenon or the physical mechanism included in the quantitative failure occurrence mechanism which is estimated in collation with the physical model, the reward calculation unit may set a second minus reward which is larger than the first minus reward; and the value function update unit may update the value function depending on the plus reward or the first or second minus reward set by the reward calculation unit.

The machine learning device can further deepen learning by performing reinforcement learning by using a result, which is obtained by machine-learning a quantitative failure occurrence mechanism corresponding to each failure among various types of failures through supervised learning, as an initial state, by the above-mentioned configuration. The machine learning device can learn more rational quantitative failure occurrence mechanisms conforming to physical models with respect to various types of failures by setting a larger minus reward when a confirmed failure occurrence state is inconsistent with a physical phenomenon or a physical mechanism included in an outputted quantitative failure occurrence mechanism compared to when the confirmed failure occurrence state is different from an failure occurrence state included in the outputted quantitative failure occurrence mechanism.

In the machine learning device, the learning unit may output a plurality of quantitative failure occurrence mechanisms for a failure such as not only a single quantitative failure occurrence mechanism of a first candidate but also a quantitative failure occurrence mechanism of a second candidate and a quantitative failure occurrence mechanism of a third candidate via the decision making unit when the learning unit detects the failure in the laser device; the reward calculation unit may set a reward whose absolute value is relatively larger as a candidate rank of the quantitative failure occurrence mechanism is higher, and the reward calculation unit may set a reward whose absolute value is relatively smaller as the candidate rank of the quantitative failure occurrence mechanism is lower, when the reward calculation unit sets a plus or minus reward with respect to the quantitative failure occurrence mechanism of each candidate; and the value function update unit may update the value function depending on the reward set by the reward calculation unit.

The machine learning device can advance learning by effectively using a small amount of failure occurrence data, by the above-mentioned configuration. Even if a failed spot or a failed component included in the quantitative failure occurrence mechanism of the first candidate is wrong, a person in charge of repair of the laser device can check a failed spot or a failed component included in the quantitative failure occurrence mechanism of the following candidate, being able to lower the probability in occurrence of the problem that a failed part is not found and restoration accordingly requires a long time.

The machine learning device may also have a function as a preventive maintenance device by referring to the quantitative failure occurrence mechanism which corresponds to each failure and which is acquired through learning, and when a value of any state variable of, or a point whose coordinate values are values of a plurality of any state variables of, the laser device which is connected to be mutually communicable via the network is close to a failure occurrence area, in which a failure occurs by any quantitative failure occurrence mechanism, more than a predetermined range, issuing a command of a failure avoidance driving condition, which is a driving condition for preventing an occurrence of a failure, to the control unit of the laser device.

The machine learning device refers to the quantitative failure occurrence mechanism which corresponds to each failure and which is acquired through learning, and when a value of any state variable or a point whose coordinate values are values of a plurality of any state variables of this laser device is close to a failure occurrence area, in which a failure occurs by any quantitative failure occurrence mechanism, the machine learning device issues a command of a failure avoidance driving condition to the control unit of this laser device, being able to prevent an occurrence of a failure before an occurrence of a failure, by the above-mentioned configuration.

The machine learning device may command the control unit of the laser device to drive the laser device in a predetermined driving condition in accordance with a predetermined schedule, record the state variable, which includes light output property data of the laser device obtained in every driving of the laser device in the predetermined driving condition, as history data of the state variable of the laser device, and include the history data, which is recorded, in a state variable observed by the state observation unit.

The machine learning device regularly records a state variable of the laser device in driving of the laser device in the same driving condition, and thus can grasp transition of the state variable of the laser device and use the transition of the state variable for learning of a quantitative failure occurrence mechanism for a failure caused by wear, by the above-mentioned configuration.

The machine learning device may have also a function as a preventive maintenance device by referring to the quantitative failure occurrence mechanism which corresponds to each failure and is acquired through learning; when observing that a value of any state variable or a point whose coordinate values are values of a plurality of any state variables approaches the failure occurrence area, in which a failure occurs by any quantitative failure occurrence mechanism, based on transition of the value of any state variable or movement transition of the point whose coordinate values are values of a plurality of any state variables, included in the history data, predicting time which is taken until the value of the state variable or the point whose coordinate values are the values of the state variables, which approaches the failure occurrence area, reaches the failure occurrence area when the laser device is driven in a standard driving condition, that is, remaining time to failure occurrence; and when the remaining time becomes shorter than predetermined time, outputting at least one of the remaining time and the quantitative failure occurrence mechanism by which a failure is predicted to occur after elapse of the remaining time.

The machine learning device has the preventive maintenance function for the case where a value of a state variable temporally slowly changes to approach a failure occurrence area and accordingly, the machine learning device can preliminarily know a failure caused by wear, for example, before an occurrence of a failure, can make it possible to precisely perform preventive maintenance, and can minimize maintenance time for the laser device, by the above-mentioned configuration.

In the machine learning device, in the case where any laser device which is connected to be mutually communicable via the network is in any state of: a state in which the laser device is newly connected to the network, a state in which an installation place of the laser device is changed, a state in which the laser device has not been driven for a longer period of time than a predetermined pausing period, a state in which components of the laser device are exchanged, and a state in which components of the laser device are adjusted, and a state variable of the laser device is not known or has a possibility of having changed from previous driving, the control unit of this laser device may be commanded to drive the laser device in a predetermined low-load driving condition before driving the laser device in a standard driving condition or a high-load driving condition, a state variable obtained in the driving in the low-load driving condition may be observed through the state observation unit, the quantitative failure occurrence mechanism which corresponds to each failure and is acquired through learning is referred to, and a quantitative failure occurrence mechanism by which a failure is predicted to occur may be outputted in a case where the failure is predicted to occur when the laser device is driven in the standard driving condition or the high-load driving condition.

The machine learning device can prevent an occurrence of a failure caused by reflection light from a protection window, which is contaminated in long term pausing, of a machining head, an occurrence of a failure occurring when unintended spots are irradiated with laser output light and reflection light due to insufficient optical axis adjustment, and an instant occurrence of a failure, by the above-mentioned configuration. When determination cannot be performed only by low-load driving, driving in a driving condition with a slightly-higher load may be tested.

The machine learning device may have a function by referring to a quantitative failure occurrence mechanism, which corresponds to each failure and is acquired through learning, and occurrence frequency of a failure corresponding to each quantitative failure occurrence mechanism and outputting a list of an item which is preferable to be improved so as to lower occurrence frequency of a failure in the laser device.

When the machine learning device learns a quantitative failure occurrence mechanism corresponding to each failure among various types of failures through learning, effective improvement for lowering failure occurrence frequency becomes clear by the above-mentioned configuration. Therefore, if the information of the improvement is outputted, effective knowledge for improving reliability of a laser device can be obtained, enabling development of a long-life laser device exhibiting high reliability. A score and a priority order may be added to each improvement item.

The machine learning device may exist on a fog server which controls at least one cell including a plurality of devices including at least one laser device via a first network.

By making the machine learning device exist on the fog server for controlling a relatively small scale cell as described above, observation of state variables of the laser device and exchange of information whose real time property is important such as a command of a failure avoidance driving condition can be performed without delay.

The machine learning device may exist on a cloud server, which controls at least one fog server, which controls at least one cell including a plurality of devices including at least one laser device via the first network, via the second network.

By making the machine learning device exist on the cloud server which has large scale recording capacity and is capable of performing large scale signal processing in high speed as described above, it becomes possible to perform signal processing in machine learning based on a neural network or the like in high speed.

A plurality of machine learning devices may exist and the plurality of machine learning devices may mutually exchange or share a result of machine learning thereamong.

It tends to take longer time to advance learning in the machine learning device because a failure does not occur so often. However, the learning progress speed can be raised through exchange or sharing of learning results in the above-mentioned configuration. Further, the above-mentioned configuration enhances accuracy in learning as well.

According to the present invention, with respect to a failure in a high power laser device which has many failure modes and of which a failure occurrence cause and a failure occurrence condition are hard to be grasped by conventional methods, physical models are referred to so as to learn a quantitative failure occurrence mechanism including a chain of physical causal relationships "how has (have) a value (values) of a state variable (state variables) changed due to what kind of cause (causes) and which part (parts) are damaged to be in which state due to what physical phenomenon" for a detected failure. Thus, a machine learning device can be provided which is capable of performing learning so as to be able to estimate a quantitative failure occurrence mechanism consistent with the physical models throughout from a failure cause to a failure state even based on a relatively small amount of failure data and output precise preventive maintenance information for preventing a failure occurrence of a laser device by using the learning result.

Further, regarding a laser device connected with the machine learning device of the present invention via a network, a laser device which is capable of preventing an occurrence of a failure and exhibits high reliability can be provided.

BRIEF DESCRIPTION OF THE DRAWINGS

FIG. 15 illustrates an example of a format of a list of a quantitative failure occurrence mechanism outputted by a machine learning device according to a seventh embodiment of the present invention.

DETAILED DESCRIPTION OF THE PREFERRED EMBODIMENTS

Figure 1:
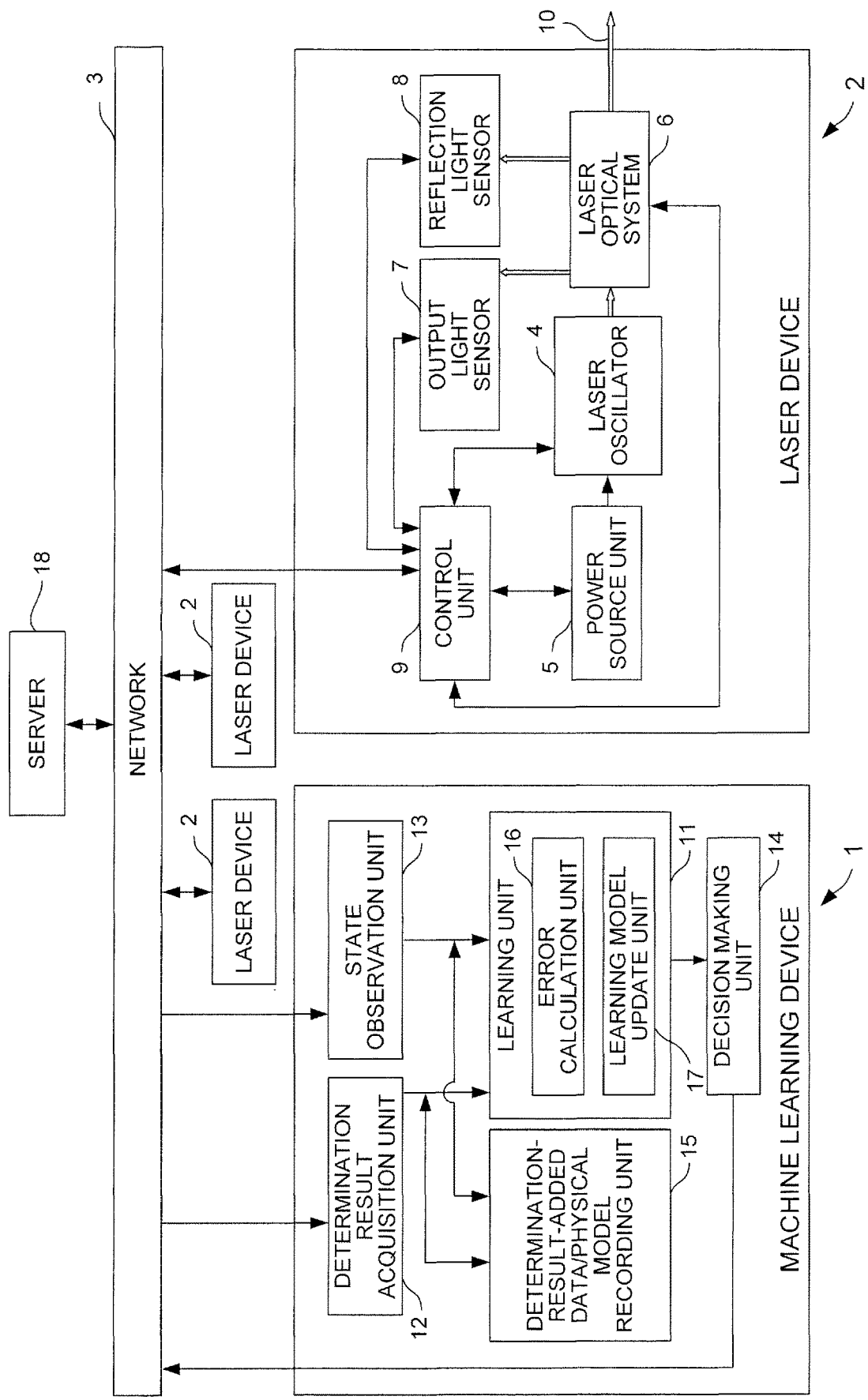
FIG. 1 is a block diagram which illustrates a conceptual configuration of a machine learning device according to a first embodiment of the present invention and to which a block diagram illustrating a conceptual configuration of a laser device connected with the machine learning device via a network is added.

A machine learning device according to embodiments of the present invention are described with reference to the accompanying drawings. Components identical among the drawings are denoted with the same reference characters. Further, components denoted with the same reference characters among different drawings have the same functions as each other. Here, dimensions are changed among the drawings as appropriate so as to make the drawings easy to see.

First Embodiment

FIG. 1 is a block diagram illustrating the conceptual configuration of a machine learning device 1 according to a first embodiment of the present invention and illustrating a state in which the machine learning device 1 is connected with three laser devices 2 via a network 3. The laser device 2 positioned right end among the three laser devices 2 is illustrated in a block diagram which illustrates the conceptual configuration of the laser device.

The laser device 2 includes a laser oscillator 4, a power source unit 5, a laser optical system 6, an output light sensor 7, a reflection light sensor 8, and a control unit 9. The power source unit 5 supplies driving current to the laser oscillator 4. The laser optical system 6 includes a machining head for irradiating a workpiece (not shown) which is a laser machining object with laser light, which is emitted from the laser oscillator 4, through an optical fiber. The output light sensor 7 detects light output of laser light 10 emitted from the laser oscillator 4. The reflection light sensor 8 detects reflection light which returns from a workpiece, a transmissive window included in the laser optical system, and an end surface of a fiber connector, for example, to the laser oscillator or the laser optical system. The control unit 9 outputs a command corresponding to each unit of the laser device 2, such as outputting a current output command corresponding to a light output command to the power source unit 5, and receives a signal from each unit of the laser device 2 such as a detection signal outputted from the output light sensor 7. The control unit 9 of each of the laser devices 2 is configured to be capable of exchanging information with the machine learning device 1 with which the control unit 9 is connected via the network 3.

The control unit 9 may be configured to be provided with a memory (not shown) in the inside or the outside thereof so as to record information related to a hardware configuration such as a configuration, a type, a drawing number, and a specification of the corresponding laser device 2 including an accessory component such as a machining head and manufacturing information of the laser device 2 such as a manufacturing date, a manufacturing lot, a manufacturing place, a manufacturing number, and a manufacturing condition in advance and to output these pieces of information to the machine learning device 1 via the network 3.

One laser device 2 may include a plurality of laser oscillators 4, power source units 5, output light sensors 7, and reflection light sensors 8. For example, the laser optical system 6 may include an optical combiner for combining laser light, and the laser device 2 may include a plurality of power source units 5 which are capable of independently supplying driving current to a plurality of laser oscillators 4 respectively, a plurality of output light sensors 7 which detect light output of respective laser oscillators and light output of combined laser light, and a plurality of reflection light sensors 8 which detect reflection light which returns to each unit of the laser oscillators and the laser optical system.

Meanwhile, the machine learning device 1 includes a state observation unit 13, a determination result acquisition unit 12, a learning unit 11, and a decision making unit 14. The state observation unit 13 observes state variables of the inside and the outside of the laser device 2 including time-series data of light output, which is detected by the output light sensor 7, and the light output command. The time-series data and the light output command are outputted from the control unit 9 of the laser device 2. The determination result acquisition unit 12 acquires a determination result on correctness with respect to the quantitative failure occurrence mechanism (=quantitative mechanism for failure occurrence) which is outputted by the machine learning device 1 for each failure in the laser device. The learning unit 11 receives output from the state observation unit 13 and output from the determination result acquisition unit 12 and learns the quantitative failure occurrence mechanism for each failure while associating the quantitative failure occurrence mechanism corresponding to each failure with a state variable of the device observed by the state observation unit 13 and a determination result, which is acquired by the determination result acquisition unit 12, on correctness with respect to the quantitative failure occurrence mechanism. The decision making unit 14 refers to a learning result of the learning unit 11 when an occurrence of the failure is detected through collation between the time-series data of the light output and the light output command, for example, and decides the quantitative failure occurrence mechanism which is to be outputted from the machine learning device 1.

State variables of each laser device which are observed and outputted to the learning unit 11 by the state observation unit 13 of the machine learning device 1 are mainly a command which is outputted to each unit of the laser device by the control unit 9 of the laser device 2, a signal received by the control unit 9 from each unit of the laser device, and information recorded in the control unit 9. Specifically, examples of state variables may include:

a hardware configuration as the one described above including a machining head of the laser device;

manufacturing information of the laser device or units and components constituting the laser device;

output data which represent a driving condition or a driving state of the laser device and are outputted from a sensor installed on the inside or the outside of the laser device;

a history of the driving condition or the driving state;

a repair history of the laser device;

internal data of control software for controlling the laser device; and the calculation data obtained based on the output data or the internal data, as well as time-series data of light output which is detected by the output light sensor 7 and a light output command. Examples of the output data may include: light output from the laser device or the laser oscillator; intensity of reflection light which propagates inside the laser optical system including an optical fiber in an opposite direction to that of laser output light; driving current or driving power of the laser diode module which is an excitation light source of the laser oscillator; a temperature of the laser diode module or a part which is thermally connected with the laser diode module; a temperature of a heat sink for suppressing temperature rise of the laser diode module; a kind, a property, a temperature, a flow rate, and pressure of refrigerant for cooling down the heat sink; intensity of vibration, acceleration, and intensity of impact which are applied to the laser device; and a temperature, humidity, cleanness, oil mist concentration, and floating particle concentration of ambient air of the laser device.

Thus, the term "state variable" is sometimes used to have a meaning of a state variable group in the present specification. Here, the configuration may be employed in which a detection signal of a sensor for detecting a peripheral environment of the laser device 2 is observed without intervention of the control unit 9.

The learning unit 11 determines that a failure has occurred when a difference between a light output command to the laser device 2 and light output obtained based on a detection result obtained by the output light sensor 7, for example, becomes larger than a predetermined range, and when a detection result which is obtained by each sensor and is to be controlled within a predetermined control range is deviated from the predetermined control range, among state variables of each laser device 2 outputted from the state observation unit 13. Then, the learning unit 11 estimates a quantitative failure occurrence mechanism including a chain of physical causal relationships including:

a failure cause triggering failure occurrence of the laser device, a value or variation thereof, which is brought by the failure cause, of a specific state variable among the state variables of the laser device, a physical phenomenon or a physical mechanism in which a damage is generated due to the value or the variation of the specific state variable, and a failure state representing a spot or a component which is damaged in the physical phenomenon or the physical mechanism and a state of the damage, and outputs the estimated quantitative failure occurrence mechanism from the decision making unit.

When it is determined that a failure has occurred, the laser device 2 in which the failure has occurred is stopped and repaired. At this time, a person in charge of repair, for example, investigates and confirms a damaged spot included in the quantitative failure occurrence mechanism outputted from the machine learning device 1 and determines whether or not a spot and a component which are actually damaged and a state of the actual damage agree with the damaged spot, a state of the damage, and a level of the damage which are included in the outputted quantitative failure occurrence mechanism, and the determination result is outputted to the learning unit 11 via the determination result acquisition unit 12.

Here, it is essentially preferable that determination is also automatically performed without intervention of human beings in machine learning, and it is conceivable to automatically perform determination by an image sensor or the like. However, it is hard for an image sensor or the like to check a failure state for all failure parts. Further, a failure does not occur so often as mentioned above and human beings ordinarily intervene in repair for a failure. The intervention of human beings in a part of machine learning according to the present invention generates small additional man-hours and small delay in processing time, so that it is considered that the learning can be more accurately performed when a failure state is precisely checked with intervention of human beings.

The learning unit 11 receives output from the state observation unit 13 and output from the determination result acquisition unit 12 and learns a quantitative failure occurrence mechanism corresponding to a failure which has occurred while associating a state variable of the laser device 2 observed by the state observation unit 13 with a determination result on correctness with respect to an estimation result (acquired from the determination result acquisition unit 12) of a quantitative failure occurrence mechanism which is outputted from the decision making unit 14.

The present embodiment describes an example of the machine learning device employing supervised learning. The machine learning device 1 further includes a determination-result-added data/physical model recording unit 15 which records data with determination result and a physical model related to a quantitative failure occurrence mechanism. The learning unit 11 includes an error calculation unit 16 and a learning model update unit 17. The error calculation unit 16 calculates a discrepancy between a quantitative failure occurrence mechanism outputted from the machine learning device 1 and a failure state which is actually confirmed, as an error. The learning model update unit 17 updates a learning model, which is a learning result, depending on a calculated error.

The determination-result-added data/physical model recording unit 15 records data with determination result, in which state variables of the laser device which have been obtained in the past are paired with correctness determination results with respect to quantitative failure occurrence mechanisms which are estimated with respect to the state variables respectively, and physical models related to failures. Regarding this physical model, it is assumed that there is a quantitative failure occurrence mechanism in which oil components, which are attached to a workpiece, become soot to be attached to a protection window of a machining head during laser machining, components obtained when laser light is reflected by the protection window, that is, the reflection light is increased to have certain wattage, the reflection light, which propagates through a delivery fiber in an opposite direction to that of laser light, scatters on a clad at a fusion point (a splice) with a feed fiber, the temperature of a protection sleeve, which surrounds the clad, rises and exceeds the ignition temperature of the protection sleeve, the protection sleeve accordingly burns, the temperature of the fiber further rises, physical properties such as a refractive index varies, transmittance of laser light is lowered, the temperature of the fiber further rises due to absorption of the laser light, and a core changes in quality (fiber fuse occurs and the laser light accordingly does not propagate through the fiber). The determination-result-added data/physical model recording unit 15 may record the whole of the quantitative failure occurrence mechanism including this chain of physical causal relationships as a physical model. Alternatively, the determination-result-added data/physical model recording unit 15 may record physical phenomena which are part of the quantitative failure occurrence mechanism such as a relation between the intensity of the reflection light, which propagates through a clad and is detected by a certain reflection light sensor, and temperature rise of the fiber, and the ignition temperature of the protection sleeve.

The learning unit 11 performs learning such that the learning unit 11 refers to data with determination result recorded in the determination-result-added data/physical model recording unit 15 or a learning result which is based on the recorded data with determination result, and a physical model, estimates a quantitative failure occurrence mechanism with respect to a state variable, which is obtained by observing the failed laser device 2 when an occurrence of the fail is determined, outputs the estimation result, and acquires a result of correctness determination with respect to the estimation.

Here, the determination-result-added data/physical model recording unit 15 does not have to be provided in the inside of the machine learning device 1. Data with determination result may be provided to the learning unit 11 by using a network, a memory card, or the like. Data with determination result and physical models do not have to be recorded in the same recording unit but may be recorded in separate recording units.

Figure 2:
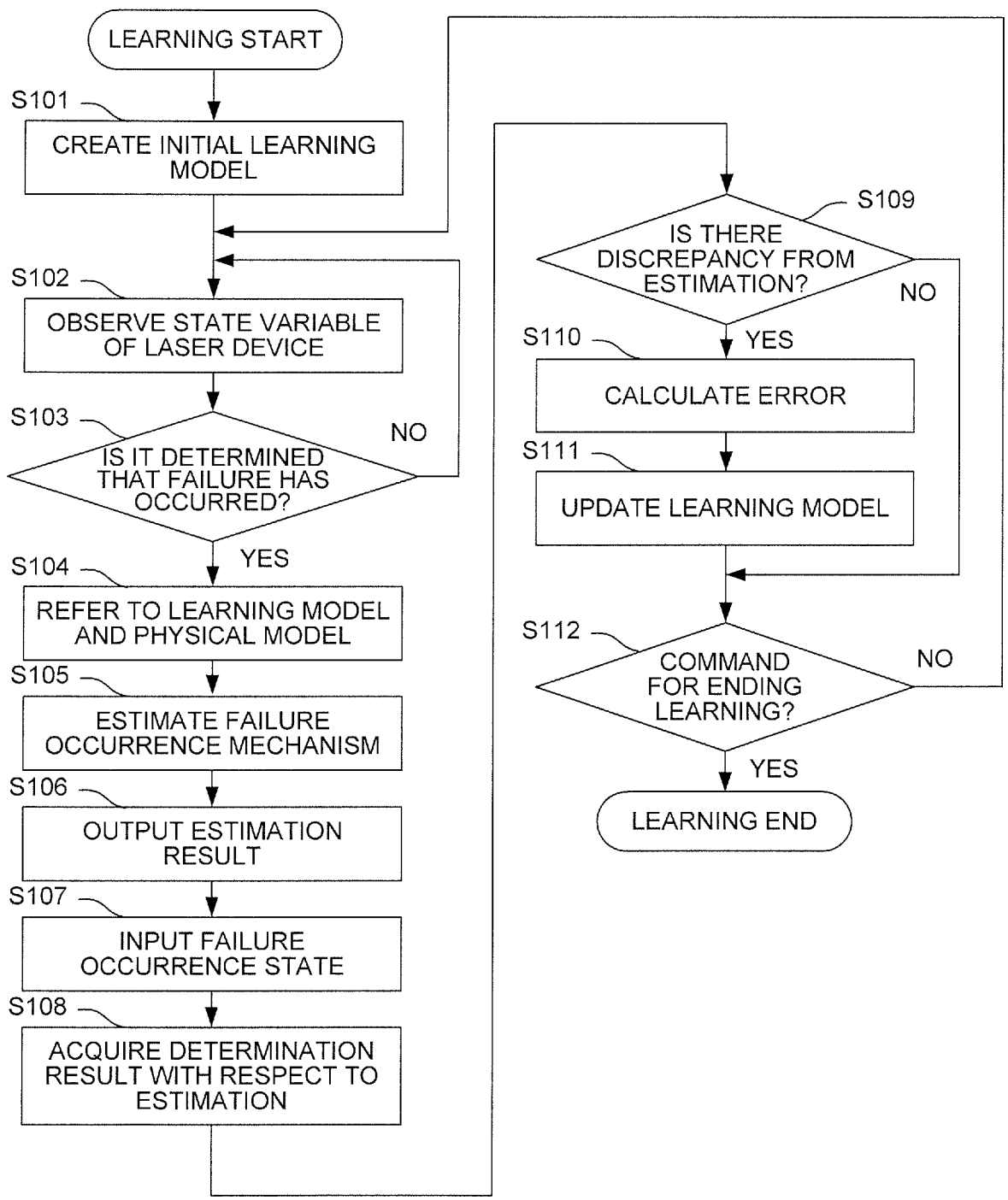
FIG. 2 is a flowchart illustrating an example of an operation of the machine learning device illustrated in FIG. 1.

FIG. 2 is a flowchart illustrating an example of an operation of the machine learning device illustrated in FIG. 1.

In the machine learning device 1 illustrated in FIG. 1, when the learning unit 11 starts learning, the learning unit 11 first refers to data with determination result and a physical model, which are recorded in the determination-result-added data/physical model recording unit 15, so as to create an initial learning model (step S101) and observes a state variable of each laser device 2 which is connected to the machine learning device 1 via the network 3 (step S102), as illustrated in FIG. 2. Further, the learning unit 11 determines whether the state variable is considered to exhibit an occurrence of a failure, such as a case where a difference between a light output command to the laser device 2 and light output calculated based on a detection result obtained by the output light sensor 7, for example, exceeds a predetermined range and a case where a detection result which is obtained by each sensor and is to be controlled within a predetermined control range deviates from the predetermined control range (step S103). When it is not determined that a failure has occurred, the processing returns to step S102 and the learning unit 11 continues the observation of the state variable of the laser device 2. On the other hand, it is determined that a failure has occurred, the learning unit 11 refers to the learning model and the physical model (step S104), estimates a sequential quantitative failure occurrence mechanism from a failure cause to a failure occurrence state (step S105), and outputs the estimated quantitative failure occurrence mechanism from the decision making unit 14 (step S106).

A person who diagnoses and repairs the failed laser device checks the failure occurrence state and inputs the failure occurrence state into the determination result acquisition unit 12 of the machine learning device 1 directly or via the network 3 (step S107). Since it is often impossible to specify a failure occurrence cause even though a failure occurrence state is checked, a failed part, a failed component, and a state of a failure or a damage which are confirmable contents in repair are generally inputted. The state of the failure or the damage includes a state in which the failed part or component is burned, melted, cracked, dislocated, disconnected, or short-circuited, for example.

The determination result acquisition unit 12 acquires a determination result with respect to the estimation result (step S108) and outputs the determination result to the learning unit 11. The learning unit 11 determines whether or not the failure occurrence state included in the estimated quantitative failure occurrence mechanism, that is, failed spot and component or damaged spot and component, and a state of the failure or damage agrees with the failure occurrence state which is actually confirmed (step S109). When there is discrepancy, the error calculation unit 16 calculates the error of the learning model depending on the level of the discrepancy (step S110), and the learning model update unit 17 updates the learning model depending on the error (step S111).

Subsequently, the learning unit 11 determines whether or not a command for ending the machine learning has been issued (step S112). When the command for ending the learning has been issued, the learning unit 11 ends the learning. When the command for ending the learning has not been issued, the processing returns to step S102 and the learning unit 11 continues the observation of the state variable of each laser device 2 connected via the network 3. In step S109, when failed spot and component or damaged spot and component, and a state of the failure or damage, which are included in the estimated quantitative failure occurrence mechanism agree with the failure occurrence state which is actually confirmed, the processing directly proceeds to step S112 and the learning unit 11 determines whether or not the command for ending the machine learning has been issued.

The learning unit 11 repeats update of the learning model through repetition of steps S101 to S112 described above, and the learning unit 11 thus performs learning so as to be able to estimate a quantitative failure occurrence mechanism based on state variables of the laser device 2.

Learning of a sequential quantitative failure occurrence mechanism from a failure cause to a failure occurrence state more securely realizes more precise estimation consistent with a physical phenomenon and a physical mechanism compared to a learning method for estimating a failure cause and a failure occurrence condition through statistical processing of state variables. Further, physically-illogical learning results can be excluded by referring to a physical model, so that probability of success in estimating a physically-rational quantitative failure occurrence mechanism becomes higher in relatively early stages of learning, that is, even in a state in which there are a relatively small amount of data on failure occurrence.

Quantitative failure occurrence mechanisms corresponding to various types of failures can be precisely learned by observing many state variables with respect to the laser device 2, so that it is preferable that the state observation unit 13 observes as many state variables, which are very likely to be related to failures, as possible, as described above.

Figure 3:
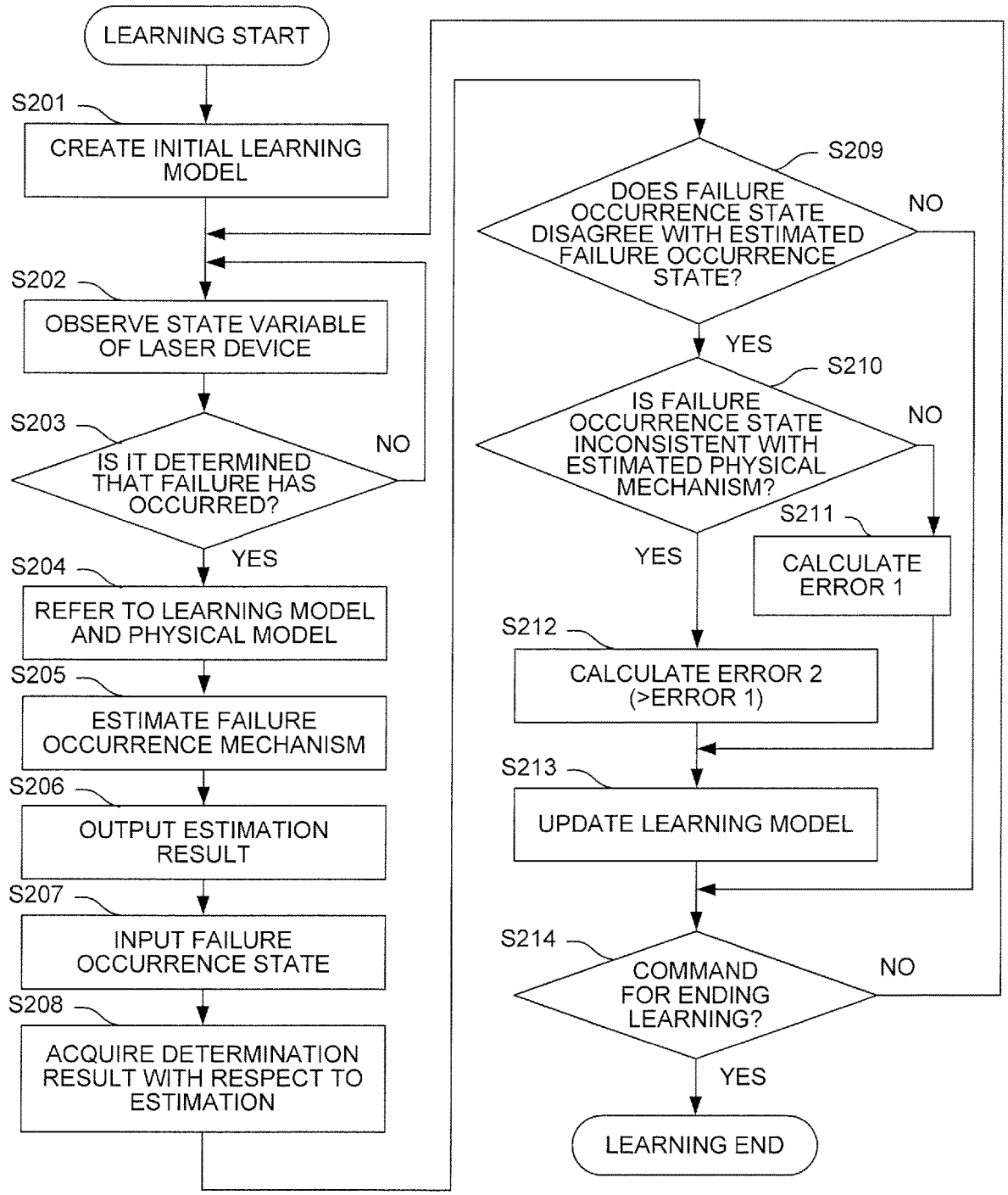
FIG. 3 is a flowchart illustrating another example of an operation of the machine learning device illustrated in FIG. 1.

FIG. 3 is a flowchart illustrating another example of an operation of the machine learning device illustrated in FIG. 1. The machine learning device includes not only presence of agreement between a failure occurrence state which is confirmed by an operator or a person in charge of repair, for example, of the laser device and a failure occurrence state included in the outputted quantitative failure occurrence mechanism, but also presence of consistency, which is examined by referring to a physical model, between a confirmed failure occurrence state and a physical phenomenon or a physical mechanism which is included in the outputted quantitative failure occurrence mechanism in determination of correctness of the quantitative failure occurrence mechanism outputted with respect to a failure occurring in the laser device.

In the flowchart in FIG. 3, step S201 to step S208 are the same as step S101 to step S108 in the flowchart of FIG. 2. Step S209 is also the same as the processing in the flowchart of FIG. 2 in that the learning unit 11 determines whether or not a failure occurrence state included in an estimated quantitative failure occurrence mechanism, that is, failed spot and component or damaged spot and component, and a state of the failure or damage agrees with the failure occurrence state which is actually confirmed (step S209) and the processing directly proceeds to step S214 and the learning unit 11 determines whether or not a command for ending the machine learning has been issued when the failure occurrence state included in the estimated quantitative failure occurrence mechanism agrees with the failure occurrence state which is actually confirmed. The processing in the flowchart in FIG. 3 is different from the processing of the flowchart of FIG. 2 in that, in step S209, when the failure occurrence state included in the estimated quantitative failure occurrence mechanism has discrepancy from the failure occurrence state which is actually confirmed, the processing proceeds to step S210 and whether or not the confirmed failure occurrence state is inconsistent with the estimated quantitative failure occurrence mechanism is determined. The learning unit 11 determines that, for example when positions of failure occurrence spots are not matched between the confirmed failure occurrence state and the failure occurrence state included in the estimated quantitative failure occurrence mechanism and the state is not a burnout state but a melted state, the confirmed failure occurrence state is not inconsistent with a physical mechanism of failure occurrence included in the estimated quantitative failure occurrence mechanism because a failure has occurred due to temperature rise even though failure occurrence states are not matched, or that the confirmed failure occurrence state is inconsistent with the failure occurrence mechanism included in the quantitative failure occurrence mechanism, because the failure of the confirmed failure occurrence state is considered not to be a failure caused by temperature rise included in the estimated quantitative failure occurrence mechanism but to be a failure caused by mechanical breakdown due to vibration or impact.

When it is determined that the confirmed failure occurrence state is not inconsistent with the physical mechanism of failure occurrence included in the estimated quantitative failure occurrence mechanism, the error calculation unit 16 recognizes occurrence of an error and calculates the error 1 (step S211) and the learning model update unit 17 updates the learning model depending on the magnitude of the error 1 in step S213. On the other hand, when it is determined that the confirmed failure occurrence state is inconsistent with the physical mechanism of failure occurrence included in the estimated quantitative failure occurrence mechanism, the error calculation unit 16 recognizes occurrence of an error 2 which is larger than the error 1 and calculates the error 2 (step S212), and the learning model update unit 17 updates the learning model depending on the magnitude of the error 2 in step S213.

After the learning model is updated, the processing proceeds to step S214 and whether or not a command for ending the machine learning has been issued is determined in the same manner as the flowchart of FIG. 2. The learning unit 11 repeats update of the learning model through repetition of steps S201 to S214 described above, and the learning unit 11 thus performs learning so as to be able to estimate a quantitative failure occurrence mechanism based on state variables of the laser device 2. As the number of learning model that is provided to one machine learning device is not restricted to one, a plurality of learning models can be provided to one machine learning device.

The addition of the determination on presence of consistency with a physical phenomenon or a physical mechanism to the determination of correctness eliminates estimation which is inconsistent with the physical model, thereby realizing learning of rational quantitative failure occurrence mechanisms with respect to various types of failures. Specifically, as the operation example illustrated in the flowchart of FIG. 3, when a confirmed failure occurrence state is not only different from a failure occurrence state included in an outputted quantitative failure occurrence mechanism but also inconsistent with a physical phenomenon or a physical mechanism included in the outputted quantitative failure occurrence mechanism, it is determined that an error of a learning result of the quantitative failure occurrence mechanism with respect to the failure is larger and a learning model is updated, making it possible to learn rational quantitative failure occurrence mechanisms conforming to physical models with respect to various types of failures.

When it becomes possible to output a quantitative failure occurrence mechanism corresponding to each failure as a result of learning, time required for repairing a failed spot can be shortened in the case of the failure occurrence because the quantitative failure occurrence mechanism includes failed spot or component as a failure occurrence state.

As an example of learning of a machine learning device performing supervised learning, the learning is advanced such that a regression equation of a prediction model as the one expressed in Formula 1 below, for example, is set, and a value of each of the coefficients $a_0, a_1, a_2, a_3, \ldots$ is adjusted so as to obtain a value of an objective variable y when a value of each of the state variables $x_1, x_2, x_3, \ldots$ is applied to the regression equation in a process of the learning. The learning method is not limited to this method and the method differs in every algorithm of supervised learning.

$$y = a_0 + a_1 x_1 + a_2 x_2 + a_3 x_3 + \ldots + a_n x_n \quad (1)$$

Various methods such as a neural network and the least-squares method are well known as an algorithm of supervised learning and any algorithm of supervised learning may be employed as a method to be applied to the present invention.

Second Embodiment

Figure 4:
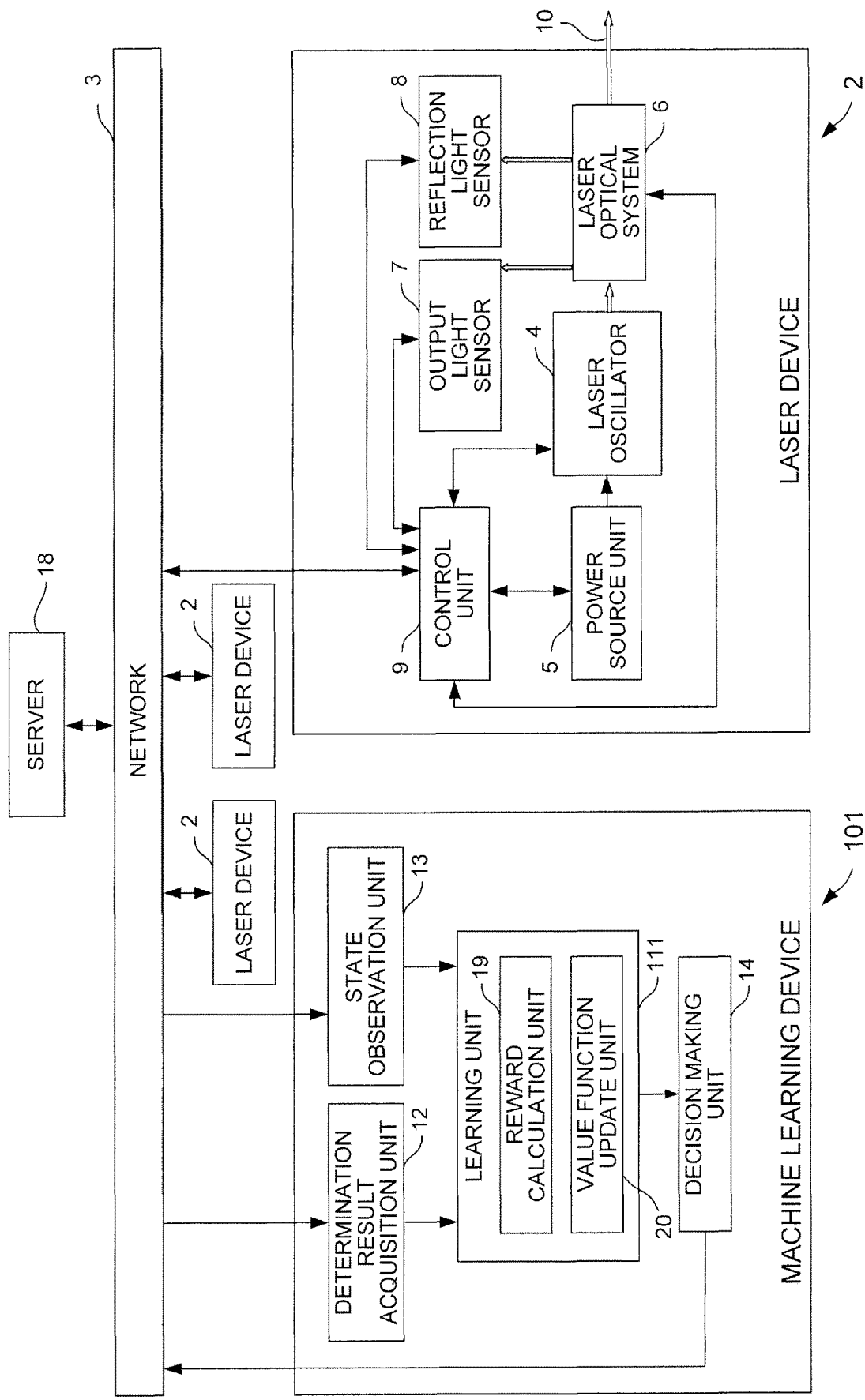
FIG. 4 is a block diagram which illustrates a conceptual configuration of a machine learning device according to a second embodiment of the present invention and to which a block diagram illustrating a conceptual configuration of a laser device connected with the machine learning device via the network is added.

FIG. 4 is a block diagram illustrating the conceptual configuration of a machine learning device 101 according to a second embodiment of the present invention and illustrating a state in which the machine learning device 101 is connected with three laser devices 2 via the network 3, as is the case with FIG. 1. The laser device 2 positioned right end among the three laser devices 2 is illustrated in a block diagram which illustrates the conceptual configuration of the laser device.

The configuration of the laser device 2 is the same as that illustrated in FIG. 1 (first embodiment). FIG. 4 is different from FIG. 1 in that FIG. 4 illustrates an example of the machine learning device 101 employing reinforcement learning in the present embodiment and a learning unit 111 includes a reward calculation unit 19 and a value function update unit 20 instead of the error calculation unit 16 and the learning model update unit 17. Further, this machine learning device 101 does not include the determination-result-added data/physical model recording unit 15 and physical models are recorded in the learning unit 111. Furthermore, it is assumed that the learning unit 111 of the present embodiment performs learning by reinforcement learning with a learning result obtained by the above-mentioned supervised learning as an initial state and the learning unit 111 already has an initial value function at the start of the reinforcement learning.

Figure 5:
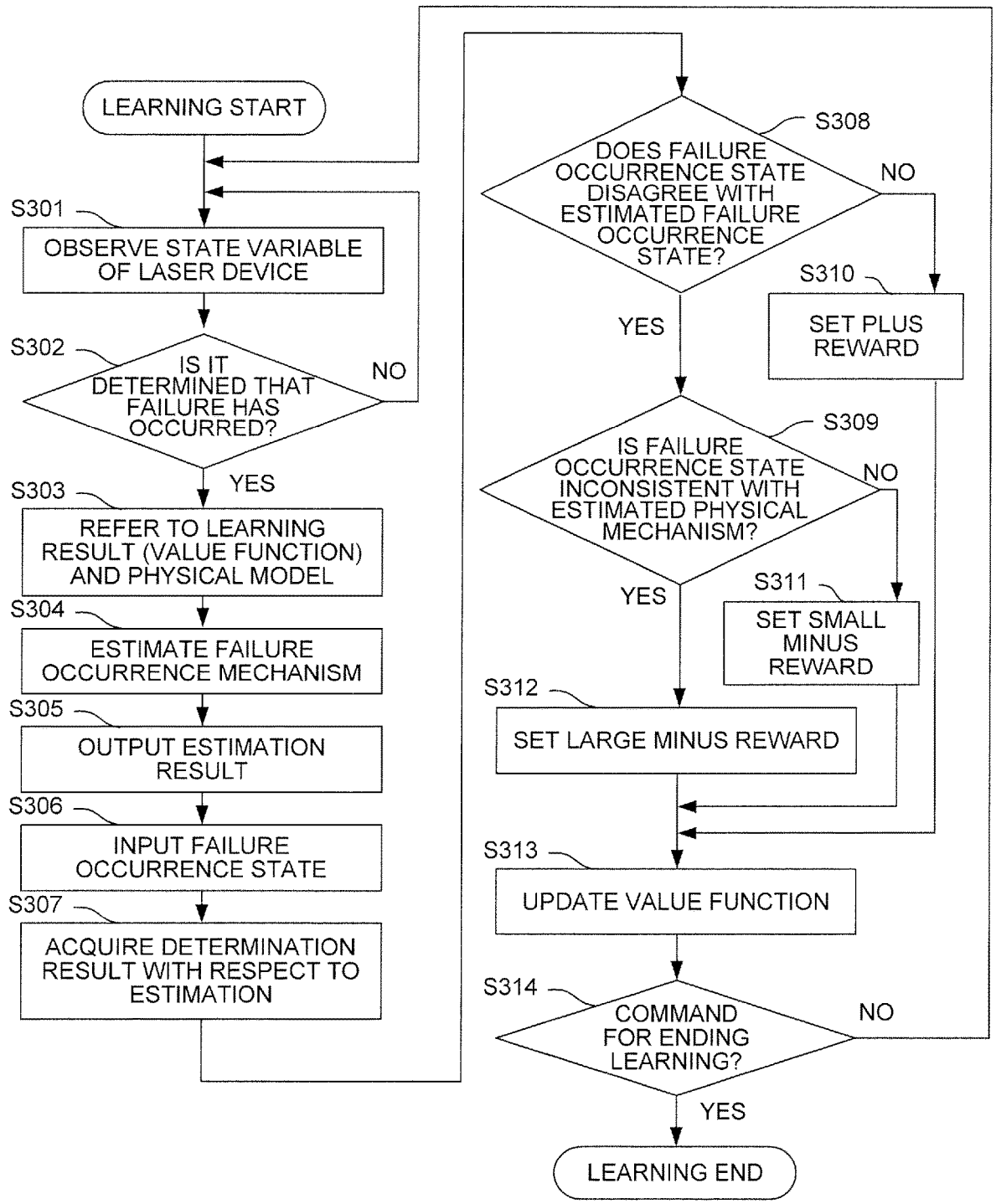
FIG. 5 is a flowchart illustrating an example of an operation of the machine learning device illustrated in FIG. 4.

FIG. 5 is a flowchart illustrating an example of an operation of the machine learning device illustrated in FIG. 4.

The flowchart of FIG. 5 does not include a step corresponding to step S201 (the step in which an initial learning model is created) of the flowchart of FIG. 3 because the initial learning result is already provided to the learning unit 111 in the processing illustrated in the flowchart of FIG. 5, and a learning result which is referred to in step S303 is not a learning model but a value function. Except for the above, step S301 to step S309 in the flowchart of FIG. 5 are the same as step S202 to step S210 in the flowchart of FIG. 3. The flowchart of FIG. 5 is different from the flowchart of FIG. 3 from step S310. That is, in step S308 the learning unit 111 determines whether or not the failure occurrence state included in the estimated quantitative failure occurrence mechanism, that is, failed spot and component or damaged spot and component, and a state of the failure or damage agrees with the failure occurrence state which is actually confirmed. When the failure occurrence state included in the estimated quantitative failure occurrence mechanism agrees with the failure occurrence state which is actually confirmed, the reward calculation unit 19 sets a plus reward (reward 1) (step S310) and the value function update unit 20 updates the value function depending on the reward in step S313.

Then, the learning unit 111 determines whether or not a command for ending the machine learning has been issued (step S314). When the command for ending the learning has been issued, the learning unit 111 ends the learning. When the command for ending the learning has not been issued, the processing returns to step S301 and the learning unit 111 continues the observation of the state variable of each laser device 2 connected via the network 3.

In step S308, when the learning unit 111 determines that the failure occurrence state included in the estimated quantitative failure occurrence mechanism, that is, the failed spot and component or the damaged spot and component, or the state of the failure or damage disagrees with the failure occurrence state which is actually confirmed, the processing proceeds to step S309. Then, in step S309, the learning unit 111 determines whether or not the confirmed failure occurrence state is inconsistent with the mechanism of failure occurrence included in the estimated quantitative failure occurrence mechanism in the state in which the confirmed failure occurrence state does not agree with the failure occurrence state included in the estimated quantitative failure occurrence mechanism, as is the case with step S210 of the flowchart in FIG. 3. When it is determined that the confirmed failure occurrence state is not inconsistent with the physical mechanism of failure occurrence included in the estimated quantitative failure occurrence mechanism, the reward calculation unit 19 sets a relatively small minus reward (reward 2) (step S311) and the value function update unit 20 updates the value function depending on the reward (step S313). On the other hand, in step S309, when it is determined that the confirmed failure occurrence state is inconsistent with the physical mechanism of failure occurrence included in the estimated quantitative failure occurrence mechanism, the reward calculation unit 19 sets a relatively large minus reward (reward 3) (step S312).

Then, after the value function update unit 20 updates the value function depending on the set reward in the following step S313, the processing proceeds to step S314 and the learning unit 111 determines whether or not a command for ending the machine learning has been issued. When the command for ending the learning has been issued, the learning unit 111 ends the learning. When the command for ending the learning has not been issued, the processing returns to step S301 and the learning unit 111 observes the state variable of each laser device 2 connected via the network 3, thus continuing the learning.

Here, the reward 1, the reward 2, and the reward 3 mentioned above have a relation as reward 3<reward 2<0<reward 1. The learning unit 111 repeats update of the value function through repetition of steps S301 to S314 described above, and the learning unit 111 thus performs learning so as to be able to estimate a quantitative failure occurrence mechanism based on state variables of the laser device 2.

Figure 6:
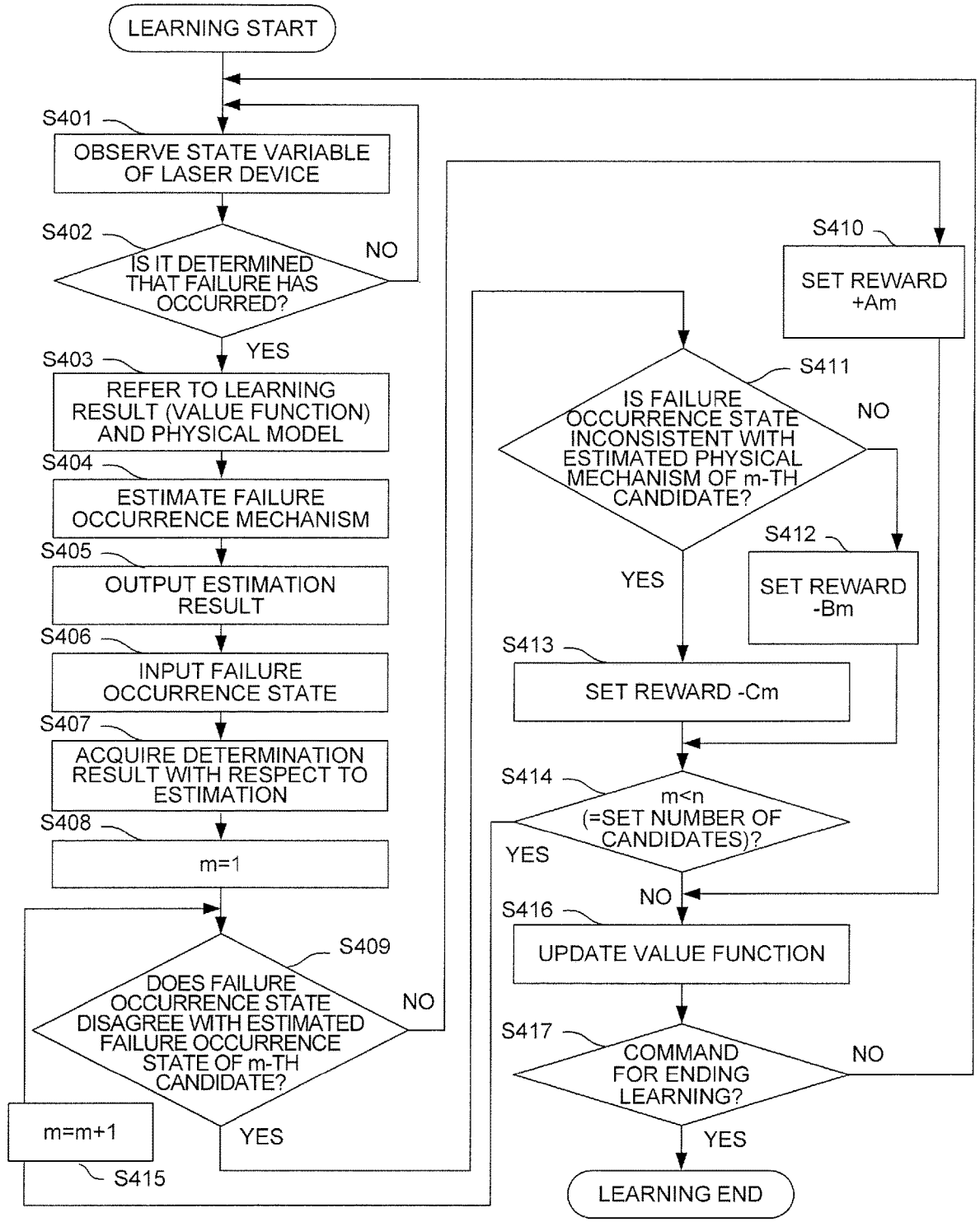
FIG. 6 is a flowchart illustrating another example of an operation of the machine learning device illustrated in FIG. 4.

FIG. 6 is a flowchart illustrating another example of an operation of the machine learning device illustrated in FIG. 4.

In the machine learning device 101, when the learning unit 111 detects a failure in the laser device 2, the learning unit 111 outputs a plurality of quantitative failure occurrence mechanisms for the failure such as not only a single quantitative failure occurrence mechanism of the first candidate but also a quantitative failure occurrence mechanism of the second candidate and a quantitative failure occurrence mechanism of the third candidate via the decision making unit 14. Meanwhile, the reward calculation unit 19 operates such that when the reward calculation unit 19 sets a plus or minus reward with respect to a quantitative failure occurrence mechanism of each candidate, the reward calculation unit 19 sets a reward whose absolute value is relatively larger as the candidate rank of the quantitative failure occurrence mechanism is higher.

Step S401 to step S407 in the flowchart of FIG. 6 are the same as step S301 to step S307 in the flowchart of FIG. 5. Subsequent to step S407, the learning unit 111 resets a value (m) of a counter to 1 (step S408) and then, the learning unit 111 determines whether or not the failure occurrence state which is actually confirmed agrees with a failure occurrence state included in the estimated quantitative failure occurrence mechanism of the m-th candidate (initially, a first candidate, because m=1) (step S409). When the failure occurrence state which is actually confirmed agrees with the failure occurrence state included in the estimated quantitative failure occurrence mechanism of the m-th candidate, the reward calculation unit 19 sets a plus reward (+Am) (step S410), the value function update unit 20 updates the value function depending on the set reward (step S416), and the learning unit 111 determines whether or not a command for ending the learning has been issued (step S417). When the command for ending the learning has been issued, the learning unit 111 ends the learning. When the command for ending the learning has not been issued, the processing returns to step S401 and the learning unit 111 continues the learning.

When it is determined that the failure occurrence state which is actually confirmed does not agree with the failure occurrence state included in the estimated quantitative failure occurrence mechanism of the m-th candidate (the first candidate because m=1 at first) in step S409, the learning unit 111 determines whether or not the confirmed failure occurrence state is inconsistent with the mechanism of failure occurrence included in the estimated quantitative failure occurrence mechanism as is the case with step S309 of FIG. 5 (step S411). When it is determined that the confirmed failure occurrence state is not inconsistent with the physical mechanism of failure occurrence included in the estimated quantitative failure occurrence mechanism, the reward calculation unit 19 sets a minus reward (−Bm) (step S412) and the learning unit 111 determines whether or not the value (m) of the counter is smaller than the set number of candidates (n) (step S414). When m<n is true, the confirmed failure occurrence state has not agreed with the failure occurrence state included in the estimated quantitative failure occurrence mechanism yet and candidates of estimated quantitative failure occurrence mechanisms are still left. Therefore, the learning unit 111 increases the value of the counter by +1 (step S415), then the processing returns to step S409 and the learning unit 111 determines whether or not a failure occurrence state included in a quantitative failure occurrence mechanism of a candidate of the following rank among the estimated quantitative failure occurrence mechanisms agrees with the failure occurrence state which is actually confirmed. When it is determined that the confirmed failure occurrence state is inconsistent with the physical mechanism of failure occurrence included in the estimated quantitative failure occurrence mechanism in step S411, the reward calculation unit 19 sets a minus reward (−Cm) (step S413) and the processing proceeds to step S414. When it is determined that m<n is not true in step S414, the confirmed failure occurrence state has not agreed with the failure occurrence state included in the estimated quantitative failure occurrence mechanism yet but any candidates of the estimated quantitative failure occurrence mechanisms are not left. Therefore, the processing proceeds to step S416 and the value function update unit 20 updates the value function depending on the total value of the rewards set in the reward calculation unit 19 (step S416).

Then, the learning unit 111 determines whether or not a command for ending the learning has been issued (step S417). When the command for ending the learning has been issued, the learning unit 111 ends the learning. When the command for ending the learning has not been issued, the processing returns to step S401 and the learning unit 111 continues the learning. The learning unit 111 repeats update of the value function through repetition of steps S401 to S417 described above, and the learning unit 111 thus performs learning so as to be able to estimate a quantitative failure occurrence mechanism based on state variables of the laser device 2. Regarding a value function as well, one machine learning device 101 can include a plurality of value functions.

Here, Am, Bm, and Cm have relations as $A1>A2> \ldots >Am> \ldots >An>0$, $B1>B2> \ldots >Bm> \ldots >Bn>0$, $C1>C2> \ldots >Cm> \ldots >Cn>0$, and $Bm<Cm$. However, in the above-mentioned operation, setting of the minus reward (−Bm) may be changed to setting of the plus reward (Bm). In this case, Am, Bm, and Cm may be set to satisfy relations: $A1>A2> \ldots >Am> \ldots >An>0$, $B1>B2> \ldots >Bm> \ldots >Bn>0$, $C1>C2> \ldots >Cm> \ldots >Cn>0$, and $Am>Bm$. Further, values of Am, Bm, and Cm may be specifically set as $Am=A1/m$, $Bm=B1/m$, and $Cm=C1/m$, for example.

As described above, learning can be further deepened by performing reinforcement learning by using a result, which is obtained by performing machine learning of quantitative failure occurrence mechanisms corresponding to various types of failures through supervised learning, as an initial state in the present embodiment. It is possible to learn more rational quantitative failure occurrence mechanisms conforming to physical models with respect to various types of failures by setting a larger minus reward when a confirmed failure occurrence state is inconsistent with a physical phenomenon or a physical mechanism included in an outputted quantitative failure occurrence mechanism compared to when the confirmed failure occurrence state is different from an failure occurrence state included in the outputted quantitative failure occurrence mechanism.

In the present embodiment as well, when it becomes possible to output a quantitative failure occurrence mechanism corresponding to each failure as a result of learning, time required for repairing a failed spot can be shortened in the case of the failure occurrence because the quantitative failure occurrence mechanism includes failed spots or components as failure occurrence states, as is the case with the first embodiment.

Especially, when the operation is performed as illustrated in the flowchart of FIG. 6, learning can be advanced by effectively using a small amount of failure occurrence data. Even if a failed spot or a failed component included in the quantitative failure occurrence mechanism of the first candidate is wrong, a failed spot or a failed component included in the quantitative failure occurrence mechanism of the following candidate can be checked. Thus, there is an advantageous effect for lowering the probability in occurrence of the problem that a failed part is not found and restoration accordingly requires a long time.

In reinforcement learning employed in the present embodiment, a method for learning an appropriate action based on interaction between an environment and an action, that is, a learning method for maximizing a reward which is to be obtained in the future is learned not only through determination and classification but also through learning of actions. The reinforcement learning makes it possible to acquire an action exerting influence in the future by obtaining results in which a failure of the laser device caused by reflection light can be avoided and cannot be avoided as a result of output of failure avoidance data, for example, as described later.

The value function update unit 20 is capable of performing reinforcement learning by using so-called Q learning. However, the method of reinforcement learning is not limited to Q learning. Q learning is a method for learning a value Q(s,a) for selecting an action a in a certain environment state s, and an action a providing the highest value Q(s,a) in a certain state s may be selected as the most appropriate action. However, a correct value of the value Q(s,a) is not first known at all for a combination of the state s and the action a, so that various actions a are selected in a certain state s and a reward is provided with respect to the actions a. Through this, selection of a better action, that is, a correct value Q(s,a) is learned.

Further, $Q(s,a)=E[\Sigma(\gamma_t)r_t]$ is aimed to be finally satisfied so as to maximize the sum of rewards obtained into the future as a result of actions. Here, E[ ] denotes an expectation value, t denotes time, γ denotes a parameter called discount rate which is described later, $r_t$ denotes a reward at time t, and Σ denotes a sum based on time t. It is assumed that an expectation value in this formula is acquired when a state is changed in accordance with the most appropriate action. The expectation value is unknown, so that the expectation value is learned through searching. An update formula of such a value Q(s,a) can be expressed as Formula 2 below, for example. That is, the value function update unit 20 updates a value function $Q(s_t,a_t)$ by using Formula 2 below.

$$Q(s_t, a_t) \leftarrow Q(s_t, a_t) + \alpha \left( r_{t+1} + \gamma \max_a Q(s_{t+1}, a) - Q(s_t, a_t) \right) \quad (2)$$

Here, $s_t$ denotes a state of an environment a, time t and $a_t$ denotes an action a, time t. The state is changed to $s_{t+1}$ depending on the action $a_t$. $r_{t+1}$ denotes a reward which is obtained based on the change of the state. The term with max is obtained by multiplying a Q value when selecting an action a having the highest Q value known a, that time under the state $s_{t+1}$ by γ. Here, γ is a parameter of 0<γ≤1 and is called a discount rate. Further, α is a learning coefficient and is within 0<α≤1.

Formula 2 above represents a method for updating an evaluation value $Q(s_t,a_t)$ of the action $a_t$ in the state $s_t$ based on a returned reward $r_{t+1}$ as a result of a test $a_t$. That is, Formula 2 represents that when a sum of the reward $r_{t+1}$ and the evaluation value $Q(s_{t+1},\max a_{t+1})$ of the best action max a in the next state based on the action a is larger than the evaluation value $Q(s_t,a_t)$ of the action a in the state s, $Q(s_t,a_t)$ is increased, and when the sum is smaller than the evaluation value $Q(s_t,a_t)$, $Q(s_t,a_t)$ is decreased. In other words, it is a method for a value of a certain action in a certain state to move close to a reward immediately returned as a result and a value of the best action in the following state based on this certain action.

Examples of a method for representing Q(s,a) on a calculator include a method in which values of all state action pairs (s,a) are maintained as an action value table and a method in which a function for approximating Q(s,a) is prepared. In the latter method, Formula 2 above can be realized by adjusting a parameter of an approximation function by a method such as a probability gradient descent method. Here, a neural network can be used as an approximation function. The neural network is composed of arithmetic devices, memories, and the like, in imitation of the model of neurons.

A neural network can be used as a learning algorithm of supervised learning and an approximation algorithm of a value function in reinforcement learning as described above, so that the machine learning device preferably includes a neural network.

Figure 7:
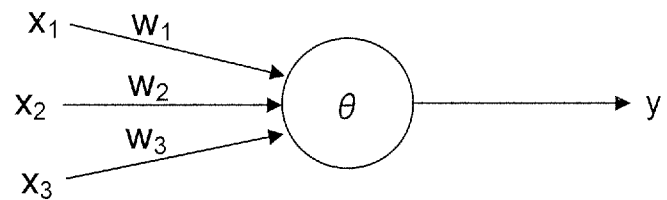
FIG. 7 schematically illustrates a model of a neuron.
Figure 8:
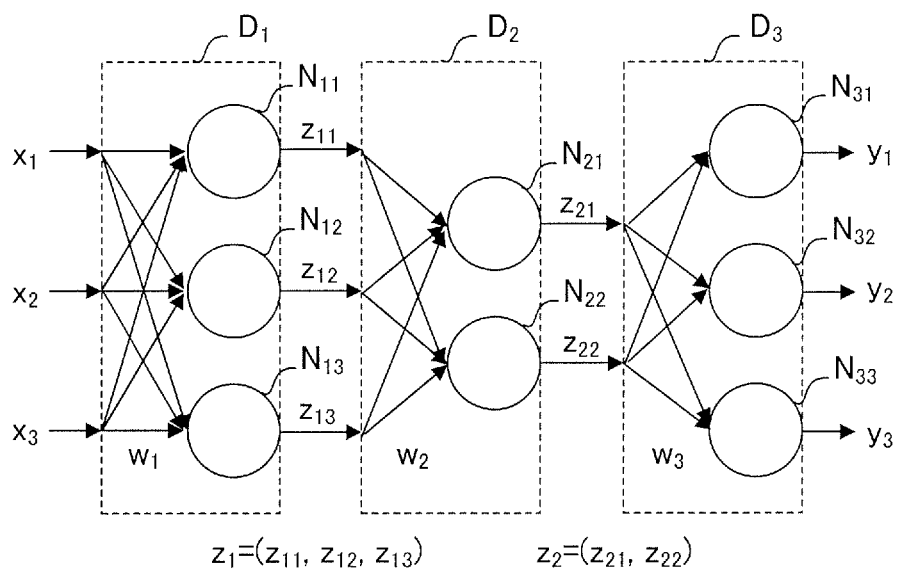
FIG. 8 schematically illustrates a three-layered neural network which is configured by combining the neurons illustrated in FIG. 7.

FIG. 7 schematically illustrates a model of a neuron, and FIG. 8 schematically illustrates a three-layered neural network which is configured by combining the neurons illustrated in FIG. 7. The neural network is composed of arithmetic devices, memories, and the like, in imitation of the model of neurons illustrated in FIG. 7. The neuron outputs an output (result) y with respect to a plurality of inputs x. Inputs x ($x_1$ to $x_3$) are respectively multiplied by weights w ($w_1$ to $w_3$) corresponding to these inputs x and the neuron outputs the output y expressed by Formula 3 below. Here, all of input x, output y, and weight w are vectors.

$$y = f_k(\Sigma_{i=1}^n x_i w_i - \theta) \quad (3)$$

Here, θ denotes a bias and $f_k$ denotes an activation function.

As illustrated in FIG. 8, a plurality of inputs x ($x_1$ to $x_3$) are inputted from the left side of the neural network and results y ($y_1$ to $y_3$) are outputted from the right side. Inputs $x_1$ to $x_3$ are each multiplied by corresponding weights and each of the inputs $x_1$ to $x_3$ is inputted into three neurons $N_{11}$ to $N_{13}$. The weights multiplied to these inputs are collectively denoted by $w_1$.

The neurons $N_{11}$ to $N_{13}$ respectively output $z_{11}$ to $z_{13}$. In FIG. 8, these zit to $z_{13}$ are collectively denoted by a feature vector $z_1$ and $z_1$ can be considered as a vector obtained by extracting a feature amount of an input vector. This feature vector $z_1$ is a feature vector between weight $w_1$ and weight $w_2$. $z_{11}$ to $z_{13}$ are each multiplied by corresponding weights and each of $z_{11}$ to $z_{13}$ is inputted into two neurons $N_{21}$ and $N_{22}$. Weights multiplied with respect to these feature vectors are collectively denoted by $w_2$. Neurons $N_{21}$ and $N_{22}$ respectively output $z_{21}$ and $z_{22}$. In FIG. 8, these $z_{21}$ and $z_{22}$ are collectively denoted by a feature vector $z_2$. The feature vector $z_2$ is a feature vector between weight $w_2$ and weight $w_3$. $z_{21}$ and $z_{22}$ are each multiplied by corresponding weights and each of $z_{21}$ and $z_{22}$ is inputted into three neurons $N_{31}$ to $N_{33}$. Weights multiplied with respect to these feature vectors are collectively denoted by $w_3$.

Finally, neurons $N_{31}$ to $N_{33}$ respectively output results $y_1$ to $y_3$. Operation modes of the neural network include a learning mode and a value prediction mode. Weight w is learned by using a learning data set in the learning mode and action determination of output of a quantitative failure occurrence mechanism can be performed by using the parameter in the value prediction mode. Here, online learning and batch learning can also be performed. In the online learning, a quantitative failure occurrence mechanism is actually outputted in the value prediction mode and the obtained data is instantaneously learned so as to reflect the learning result to the next action. In the batch learning, learning is performed at a time by using a data set obtained by preliminarily collecting data to perform a value prediction mode based on the parameter thereafter. A learning mode can be interposed every time a certain amount of data is accumulated.

The weights $w_1$ to $w_3$ can be learned by the backpropagation. Information of an error enters from the right side and flows toward the left side. The backpropagation is a method for adjusting (learning) each weight so as to reduce a difference between output y which is obtained when an input x is inputted and true output y (teacher) for each neuron.

An intermediate layer (hidden layer) of the neural network in FIG. 8 is a single layer, but the number of intermediate layers may be set to two or more. Learning in which the number of intermediate layers is two or more is called deep learning.

Learning methods of supervised learning and reinforcement learning have been concisely described above, but a machine learning method applicable to the present invention is not limited to these methods. Various methods such as "supervised learning", "unsupervised learning", "semi-supervised learning", and "reinforcement learning" which can be employed in the machine learning device are applicable.

Third Embodiment

Figure 9A:
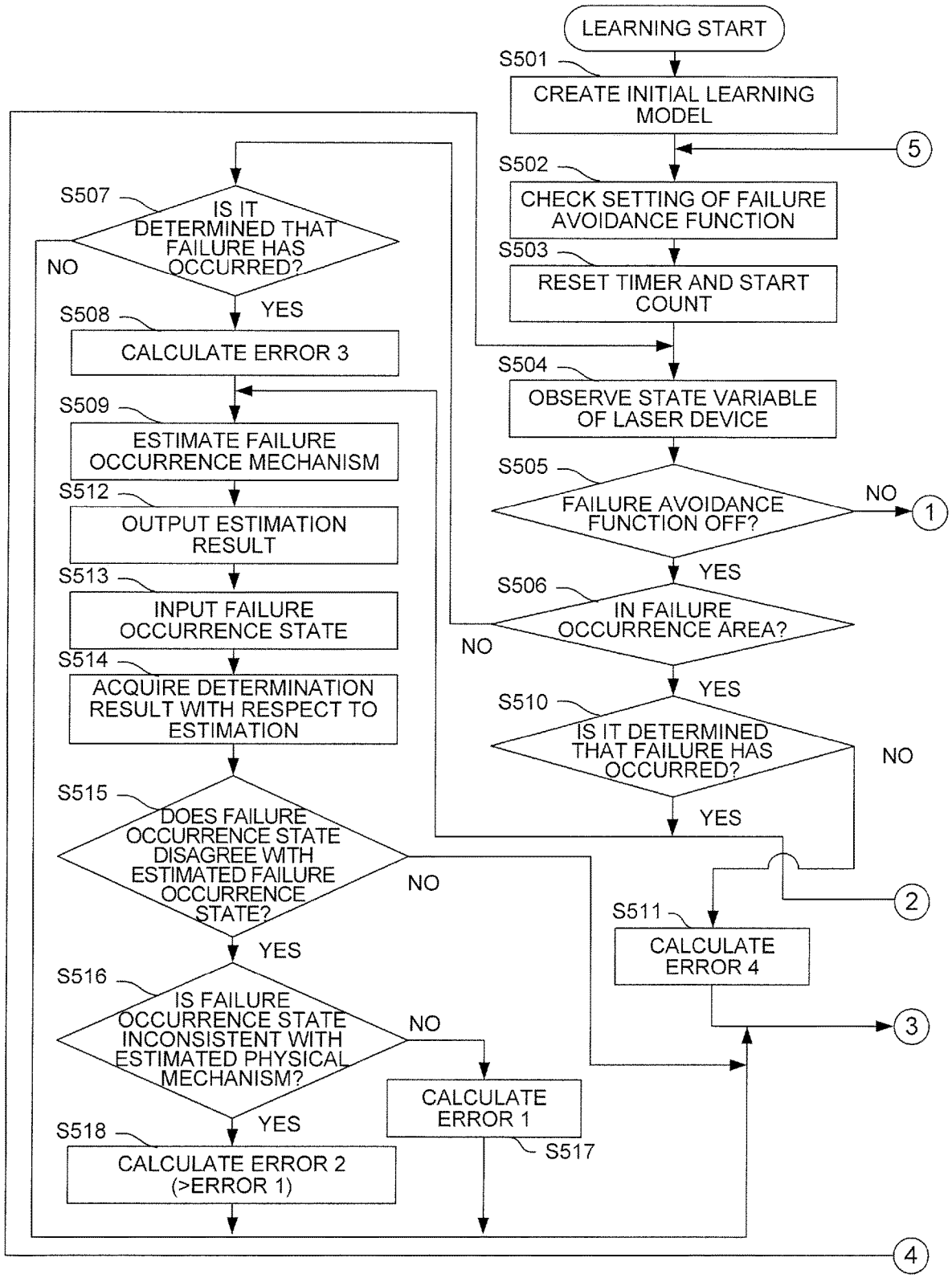
FIGS. 9A and 9B are flowcharts illustrating an example of an operation of the machine learning device according to a third embodiment of the present invention.
Figure 9B:
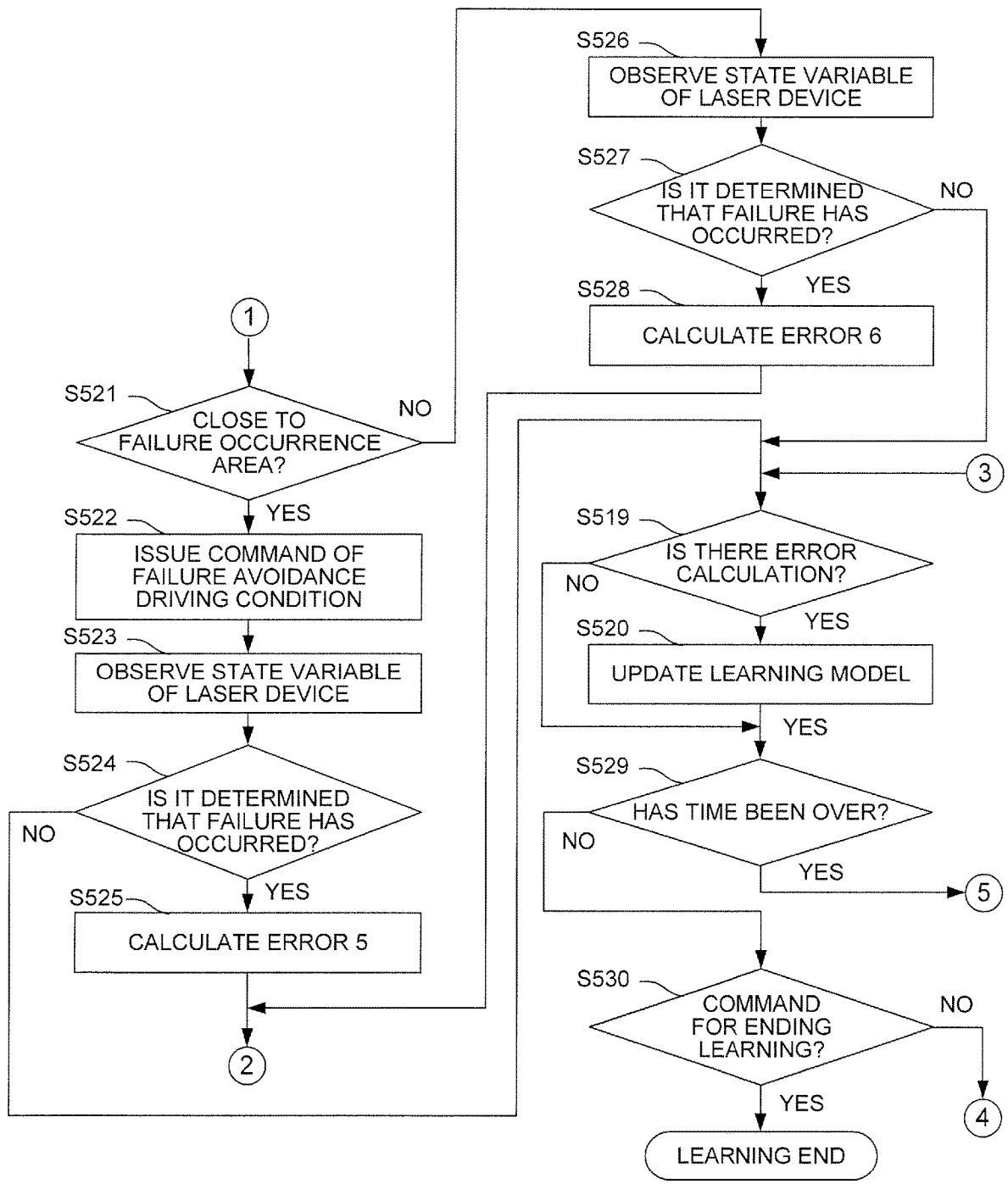

FIGS. 9A and 9B are flowcharts illustrating an example of an operation of a machine learning device according to a third embodiment of the present invention.

According to an operation of these flowcharts, the machine learning device 1 which performs learning by supervised learning according to the first embodiment of the present invention also has a function as a preventive maintenance device by referring to a quantitative failure occurrence mechanism which corresponds to each failure among various types of failures and which is acquired through the learning, and when a value of any state variable, or a point whose coordinate values are values of a plurality of any state variables, of any laser device 2 which is connected to be mutually communicable via the network 3 comes close to a failure occurrence area, in which a failure occurs by any quantitative failure occurrence mechanism, more than a predetermined range, issuing a command of a failure avoidance driving condition, which is a driving condition for preventing an occurrence of a failure, to the control unit 9 of this laser device 2.

Figure 10:
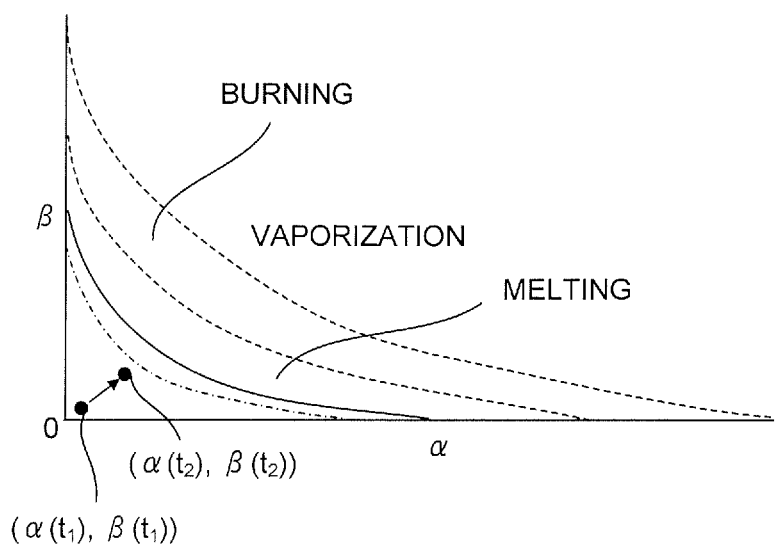
FIG. 10 schematically illustrates an example of a failure occurrence area and a state, in which a point whose coordinate values are values of state variables moves in a two-dimensional space whose coordinate axes are values of state variables.

FIG. 10 schematically illustrates a state in which a value of any state variable, or a point whose coordinate values are values of a plurality of any state variables, of any laser device 2 comes close to a failure occurrence area more than a predetermined range.

FIG. 10 schematically illustrates a state in which a point whose coordinate values are values of two state variables which are α and β among state variables of the laser device 2 approaches a two-dimensional failure occurrence area. $t_i$ denotes time and t2 denotes time coming later than $t_i$.

In FIG. 10, an area away from the origin (a point on α=β=0) with a solid line as a boundary represents a failure occurrence area, an area close to the origin with the solid line as a boundary represents an outside area of the failure occurrence area (=an area in which a failure does not occur), and an area between the solid line and a dashed dotted line represents an area close to the failure occurrence area more than a predetermined range. When the point whose coordinate values are the values of α and β goes beyond the dashed dotted line from the origin side, it is determined that the point has approached the failure occurrence area more than the predetermined range. In the example of FIG. 10, it is determined that the point is close to the failure occurrence area more than the predetermined range when the point approaches the failure occurrence area by 80%. Further, in FIG. 10, dashed lines drawn in the failure occurrence area represent boundaries of states and levels of failures. FIG. 10 illustrates that a damaging state of a failed part is on a level of melting when the point whose coordinate values are the values of α and β enters the failure occurrence area only a little, and that the failure state indicates that the temperature becomes higher from burning to vaporizing as the point goes farther from the origin.

Figure 11:
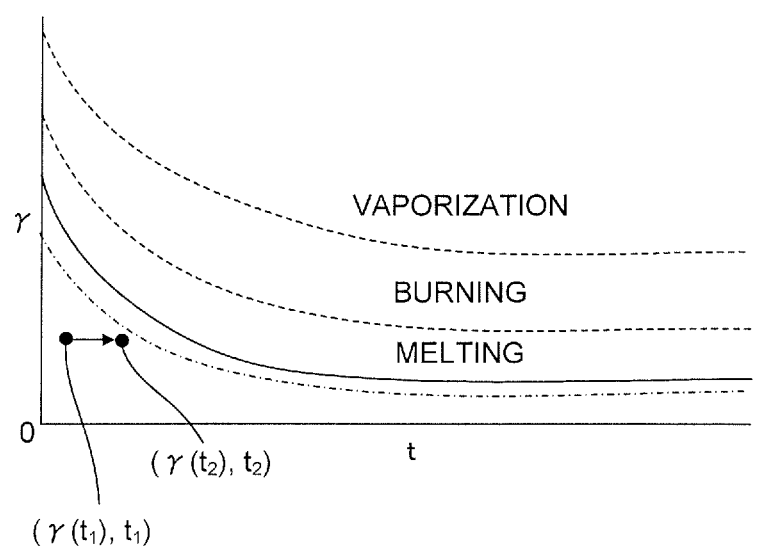
FIG. 11 schematically illustrates another example of a failure occurrence area and a state, in which a point whose coordinate values are values of state variables moves in a two-dimensional space whose coordinate axes are values of state variables.

Since state variables of the laser device 2 acquired by the state observation unit 13 include time series data as well, variables of α and β in FIG. 10 may be time. When a horizontal axis is assumed to represent time, a graph as shown in FIG. 11 is obtained. FIG. 11 illustrates that a failure does not occur even though a value of a state variable denoted by γ is relatively large if an operation is performed in a short period of time, but a point enters the failure occurrence area when this state is maintained over a long period of time. Therefore, if the condition is shifted to the failure avoidance driving condition within a short period of time, a failure can be avoided. Specific examples of the failure avoidance driving condition may include reduction in laser light output and stop of laser oscillation, but the failure avoidance driving condition is not limited to these and may be increase of cooling performance of a cooler which cools the laser oscillator, for example. A solid line, dashed lines, a dashed dotted line, $t_1$, and $t_2$ in FIG. 11 represent the same as those of FIG. 10. A quantitative failure occurrence mechanism which corresponds to each failure and is acquired through learning by the machine learning devices 1 and 101 also includes information as those illustrated in FIG. 10 and FIG. 11.

FIG. 10 and FIG. 11 illustrate the example of a state variable which does not have a negative value, so as to simplify the description. Needless to say, a state variable defining a failure occurrence area may have a negative value. Further, a point whose coordinate values are values of state variables is a virtual point and does not have to limitedly represent a point on a two-dimensional plane such as FIG. 10 and FIG. 11. The point may be a point on a one-dimensional line, may be a point in a three-dimensional space, or may be a point in a four-dimensional or five-dimensional virtual space, for example. A corresponding failure occurrence area is defined in a space of a dimension which is the same as that of a point whose coordinate values are values of the state variables.

The description returns to the description of the flowcharts of FIGS. 9 A and 9B. When the learning unit 11 starts learning, the learning unit 11 first refers to data with determination result and physical models which are recorded in the determination-result-added data/physical model recording unit 15 and creates an initial learning model (step S501). Then, the learning unit 11 checks whether a failure avoidance function is set to be on or off (step S502), and after resetting a timer for measuring elapsed time, the learning unit 11 newly starts count of elapsed time by the timer (step S503). Here, on/off setting of the failure avoidance function may be performed for each laser device. Alternatively, setting may be performed such that setting of the failure avoidance function of a laser device for limit characteristic test is maintained to be off and the failure avoidance function of other laser devices is set to be on, for example.

Subsequently, the learning unit 11 observes a state variable of each laser device 2 connected to the machine learning device 1 via the network 3 (step S504) and determines the on/off setting state of the failure avoidance function (step S505). Though a failure avoidance operation is not performed with respect to the laser device 2 whose setting of the failure avoidance function is determined to be off, the learning unit 11 refers to previously-obtained learning results and determines whether or not a value of a state variable, or a point whose coordinate values are values of a plurality of state variables, of the laser device 2 has entered the failure occurrence area (step S506), as described above. When the learning unit 11 determines that a value of a state variable, or a point whose coordinate values are values of a plurality of state variables, of the laser device 2 has not entered the failure occurrence area in step S506, the learning unit 11 determines whether or not the state variable represents a state in which a failure is considered to have occurred, such as a state in which a difference between a light output command to the laser device 2 and light output obtained based on, for example, a detection result obtained by the output light sensor 7 is larger than a predetermined range and a state in which a detection result which is obtained by each sensor and is to be controlled within the predetermined control range deviates from the predetermined control range (step S507). When it is determined that a failure has not occurred, the processing proceeds to step S519. When it is determined that a failure has occurred, it is considered that an error has been generated in the learning result (learning model) and the error calculation unit 16 calculates the error 3 (step S508), because it is determined that the failure has occurred even though it has been determined that a value of a state variable, or a point whose coordinate values are values of a plurality of state variables, of the laser device 2 has not entered the failure occurrence area. Subsequently, the learning unit 11 refers to previously-obtained learning results and recorded physical models so as to estimate a quantitative failure occurrence mechanism including a sequential content from a failure cause to a failure occurrence state (step S509), and outputs the estimated quantitative failure occurrence mechanism from the decision making unit 14 (step S512).

When the learning unit 11 determines that a value of a state variable, or a point whose coordinate values are values of a plurality of state variables, of the laser device 2 has entered the failure occurrence area in step S506, the learning unit 11 determines whether or not the state variable represents a state in which a failure is considered to have occurred as is the case with step S507 (step S510). When it is determined that a failure has occurred, the learning unit 11 determines that a value of a state variable, or a point whose coordinate values are values of a plurality of state variables, of the laser device 2 has entered the failure occurrence area. Thus, it is determined that a failure has occurred and accordingly, an error is not found in a learning result, so that the processing directly proceeds to step S509. When it is determined that a failure has not occurred in step S510, it is considered that an error has been generated in the learning model and the error calculation unit 16 calculates the error 4 (step S511), because it is determined that the failure has not occurred even though it has been determined that a value of a state variable, or a point whose coordinate values are values of a plurality of state variables, of the laser device 2 has entered the failure occurrence area. Then, the processing proceeds to step S519.

Step S512 to step S518 of FIG. 9A are almost the same as step S206 to step S212 of the flowchart in FIG. 3. A failure occurrence state confirmed by a person in charge of administration or a person in charge of repair, for example, of the laser device 2 is inputted (step S513). The determination result acquisition unit 12 acquires the confirmed failure occurrence state as a determination result with respect to the estimated quantitative failure occurrence mechanism and outputs the determination result to the learning unit 11 (step S514). The learning unit 11 determines whether or not the failure occurrence state included in the estimated quantitative failure occurrence mechanism, that is, failed spot and component or damaged spot and component, and a state of the failure or the damage agrees with the failure occurrence state which is actually confirmed (step S515). When the failure occurrence state included in the estimated quantitative failure occurrence mechanism agrees with the failure occurrence state which is actually confirmed, the processing proceeds to step S519. When the failure occurrence state included in the estimated quantitative failure occurrence mechanism has discrepancy from the failure occurrence state which is actually confirmed, the processing proceeds to step S516 and the learning unit 11 determines whether or not the confirmed failure occurrence state is inconsistent with the estimated quantitative failure occurrence mechanism. As described above, the learning unit 11 determines that, for example when a failure occurrence spot is out of position and the state is not a burnout state but a melted state, the confirmed failure occurrence state is not inconsistent with a physical mechanism of failure occurrence included in the estimated quantitative failure occurrence mechanism because a failure is caused by temperature rise although the failure occurrence state is inconsistent, or determines that the confirmed failure occurrence state is inconsistent with the failure occurrence mechanism included in the quantitative failure occurrence mechanism because the confirmed failure occurrence state is not considered to be a failure caused by temperature rise included in the estimated quantitative failure occurrence mechanism but considered to be a failure caused by mechanical breakdown due to vibration or impact. When it is determined that the confirmed failure occurrence state is not inconsistent with the physical mechanism of failure occurrence included in the estimated quantitative failure occurrence mechanism, the error calculation unit 16 calculates an error 1 (step S517). Then, the processing proceeds to step S519. On the other hand, when it is determined that the confirmed failure occurrence state is inconsistent with the physical mechanism of failure occurrence included in the estimated quantitative failure occurrence mechanism in step S516, the error calculation unit 16 calculates an error 2 which is larger than the error 1 (step S518). Then, the processing proceeds to step S519.

On the other hand, regarding the laser device 2 which is determined that the failure avoidance function thereof is set to be on in step S505, the learning unit 11 determines whether a value of any state variable, or a point whose coordinate values are values of a plurality of any state variables, of the laser device 2 comes close to the failure occurrence area, in which a failure occurs by any quantitative failure occurrence mechanism, more than the predetermined range (step S521). When it is determined that the value or the point comes close to the failure occurrence area more than the predetermined range, the machine learning device 1 commands the laser device 2 to switch a driving condition to the failure avoidance driving condition so as to avoid a failure of the laser device 2 (step S522). After that, the learning unit 11 observes the state variable of the laser device 2 again (step S523) so as to determine whether or not the state variable represents a state in which a failure is considered to have occurred (step S524). If the learning result is correct, it is correctly determined that a value of any state variable or point whose coordinate values are values of a plurality of any state variables comes close to the failure occurrence area, in which a failure occurs by any quantitative failure occurrence mechanism, more than the predetermined range, and the failure avoidance driving condition that is commanded to the laser device 2 is appropriate, it is not considered that a failure has occurred. The case where it is still determined that a failure has occurred represents that the learning result has an error, the fact that a value of any state variable or point whose coordinate values are values of a plurality of any state variables comes close to the failure occurrence area, in which a failure occurs by any quantitative failure occurrence mechanism, more than the predetermined range, or the issued command of the failure avoidance driving condition is not appropriate. Accordingly, the error calculation unit 16 calculates an error 5 (step S525), and the processing returns to step S509 and proceeds to the flow in which the learning unit 11 refers to learning models and physical models so as to estimate a quantitative failure occurrence mechanism. The case where it is determined that a failure has not occurred in step S524 represents that failure avoidance has been correctly performed, and the processing proceeds to step S519.

On the other hand, when it is determined that a value of any state variable or point whose coordinate values are values of a plurality of any state variables is not close to the failure occurrence area, in which a failure occurs by any quantitative failure occurrence mechanism, more than the predetermined range in step S521, the learning unit 11 observes the state variable of the laser device 2 again (step S526) so as to determine whether or not the state variable represents a state in which a failure is considered to have occurred (step S527). If the learning result is correct and it is correctly determined that a value of any state variable or point whose coordinate values are values of a plurality of any state variables is not close to the failure occurrence area, in which a failure occurs by any quantitative failure occurrence mechanism, more than the predetermined range, it is not considered that a failure has occurred. The case where it is still determined that a failure has occurred represents that the learning result has an error and it is not correctly determined that a value of any state variable or point whose coordinate values are values of a plurality of any state variables is close to the failure occurrence area, in which a failure occurs by any quantitative failure occurrence mechanism, more than the predetermined range. Accordingly, the error calculation unit 16 calculates an error 6 (step S528), and the processing returns to step S509 and proceeds to the flow in which the learning unit 11 refers to learning models and physical models so as to estimate a quantitative failure occurrence mechanism as is the case with the above-described case. When it is determined that a failure has not occurred in step S527, it is determined that a value of any state variable or point whose coordinate values are values of a plurality of any state variables is not close to the failure occurrence area, in which a failure occurs by any quantitative failure occurrence mechanism, more than the predetermined range. Thus, it is determined that a failure has not occurred and accordingly, an error is not found in the learning result, so that the processing proceeds to step S519.

As described above, all of the above-described flows join step S519, and whether or not there is an error calculated in the error calculation unit 16 (precisely, an error which is newly calculated after update of the learning model) is determined in step S519. When it is determined that there is at least one calculated error, the learning model update unit 17 updates the learning model depending on the magnitude of the calculated error (step S520). Then, the learning unit 11 determines whether or not the time set by the timer for measuring elapsed time has been over (step S529). When it is determined that there is no calculated error in step S519, update of the learning model is skipped and the processing proceeds to step S529. When it is determined that the set time has not been over in step S529, the learning unit 11 determines whether or not a command for ending the machine learning has been issued (step S530). When the command for ending the learning has been issued, the learning unit 11 ends the learning. When the command for ending the learning has not been issued, the processing returns to step S504 and the learning unit 11 continues the observation of the state variable of the laser device 2. When it is determined that the set time has been over in step S529, the processing returns to step S502 and the learning unit 11 confirms whether the failure avoidance function is set to be on or off and after resetting the timer, the learning unit 11 newly restarts count of elapsed time by the timer (step S503). Elapsed time is thus measured by the timer so as to regularly check whether or not an on/off setting state of the failure avoidance function is changed.

When at least one error is calculated, the learning model update unit 17 updates the learning model depending on the magnitude of the calculated error in step S520, as described above. In this case, magnitudes of respective errors may have the following relation as well as the relation of error 2>error 1 mentioned above. The error 3 and the error 4 are related to a matter of positional accuracy of a boundary between the failure occurrence area and the outside of the failure occurrence area. Calculation is performed such that the error is larger as a value of any state variable related to a failure or a point whose coordinate values are values of a plurality of any state variables related to a failure, which is used for the determination in step S506, is farther from this boundary. When a difference between a value of any state variable related to a failure or a point whose coordinate values are values of a plurality of any state variables related to a failure, which is used for the determination in step S506, and the boundary is the same, the magnitude of the error 3 and the magnitude of the error 4 may be set as the same. Regarding the error 5, a failure avoidance driving condition is commanded when it is detected that a value of any state variable related to a failure or a point whose coordinate values are values of a plurality of any state variables related to a failure is close to the failure occurrence area more than the predetermined range, but a failure has occurred. Therefore, the failure avoidance driving condition may be inappropriate. However, the failure has occurred on a position of a value of a state variable or a point whose coordinate values are values of a plurality of any state variables, which is estimated to be on the safer side from the above-mentioned boundary between the failure occurrence area and the outside of the failure occurrence area, so that the error 5 may be calculated to be larger than the error 3 and the error 4 in normal cases.

On the other hand, the error 6 is an error corresponding to the result that a failure has occurred before it is detected that a value of any state variable or point whose coordinate values are values of a plurality of any state variables is close to the failure occurrence area, in which a failure occurs by any quantitative failure occurrence mechanism, more than the predetermined range. Therefore, the error 6 may be calculated to be an error larger than the error 5.

The machine learning device 1 repeats update of the learning model through repetition of steps S501 to S530 described above, and the machine learning device 1 thus performs learning so as to be able to estimate a quantitative failure occurrence mechanism based on state variables of the laser device 2 and refers to learning results so as to issue a command of a precise failure avoidance driving condition with respect to the laser device 2 when it seems that a failure will occur in the laser device 2. As a result, failures in the laser device can be gradually reduced and a laser device exhibiting high reliability can be realized.

Fourth Embodiment

Figure 12A:
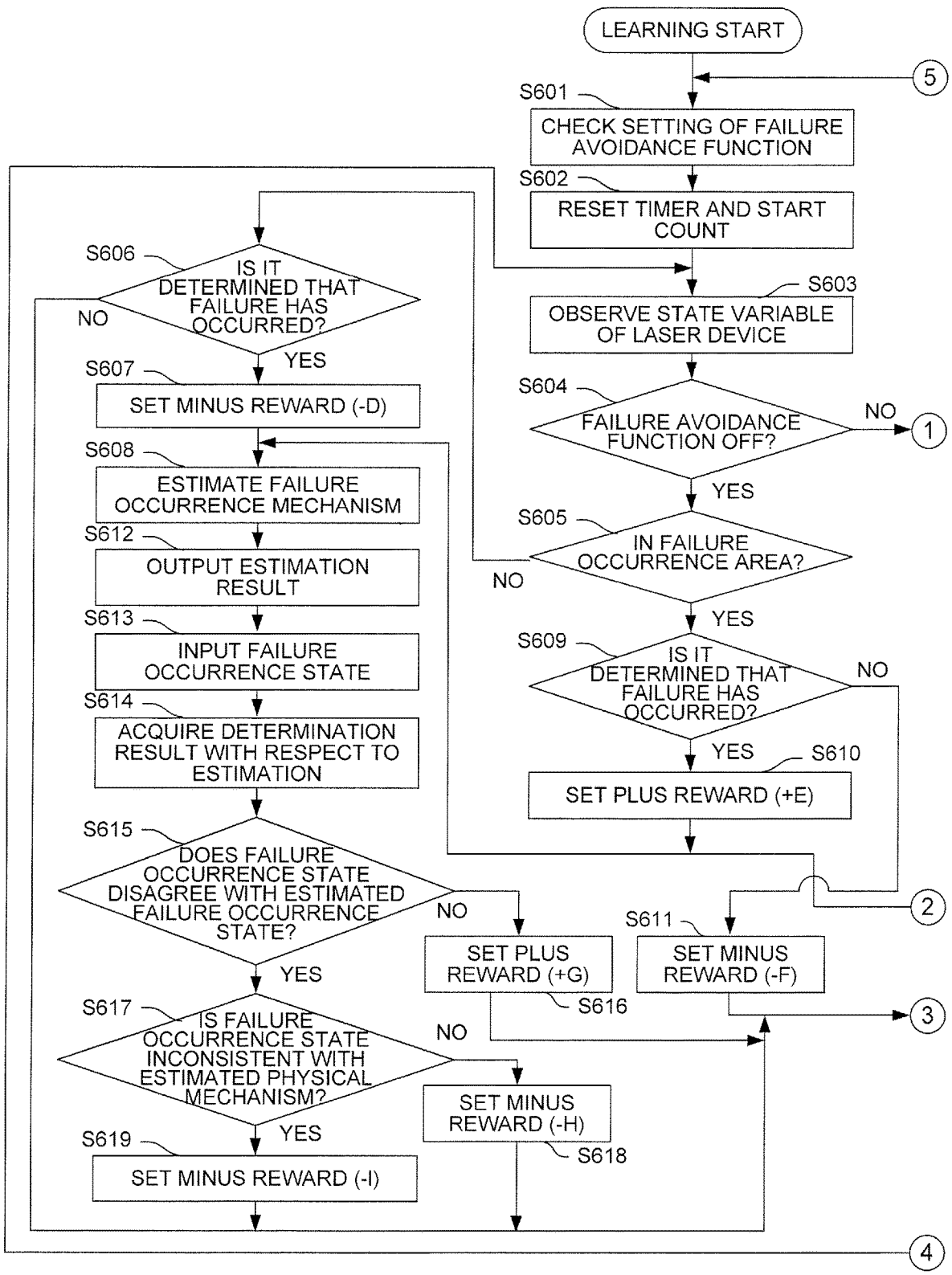
FIGS. 12A and 12B are flowcharts illustrating an example of an operation of a machine learning device according to a fourth embodiment of the present invention.
Figure 12B:
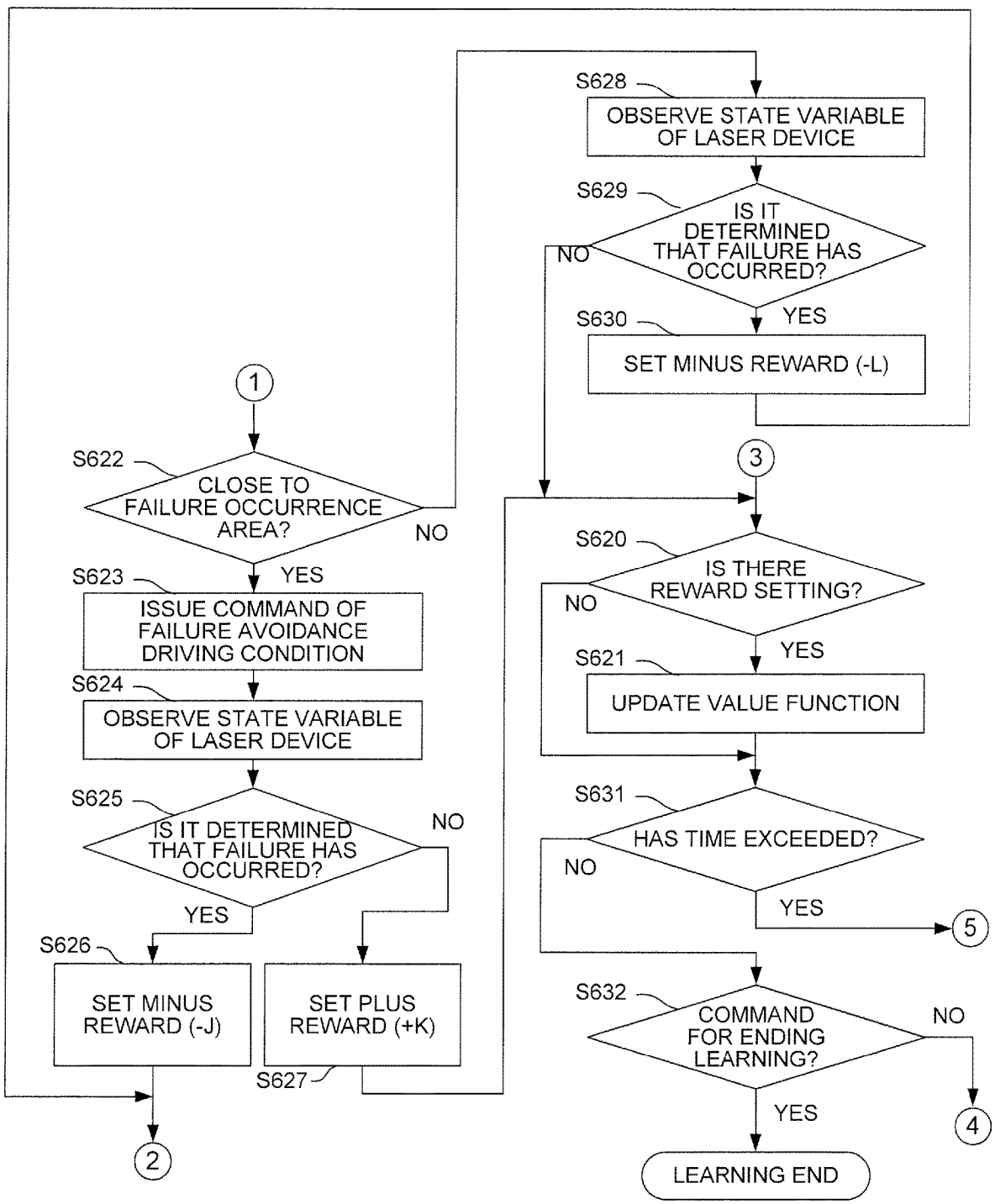

FIGS. 12A and 12B are flowcharts illustrating an example of an operation of a machine learning device according to a fourth embodiment of the present invention.

The machine learning device according to the present embodiment corresponds to a machine learning device obtained by adding a function as a preventive maintenance device that issues a command of a driving condition (a failure avoidance driving condition) for preventing an occurrence of a failure, to the above-described machine learning device 101 (FIG. 4) that performs learning through reinforcement learning according to the above-described second embodiment. That is, the machine learning device according to the present embodiment refers to a quantitative failure occurrence mechanism which corresponds to each failure and is acquired through learning, and when a value of any state variable, or a point whose coordinate values are values of a plurality of any state variables, of the laser device 2, which is connected to be mutually communicable via the network 3, is close to a failure occurrence area, in which a failure occurs by any quantitative failure occurrence mechanism, more than a predetermined range, the machine learning device commands the control unit 9 of this laser device 2 to shift a driving condition to a driving condition for preventing an occurrence of a failure (that is, the failure avoidance driving condition).

In the flowchart in FIG. 12A, step S601 to step S606 are almost the same as step S502 to step S507 in the flowchart in FIG. 9A. When the learning unit 111 starts learning, the learning unit 111 checks whether the failure avoidance function is set to be on or off (step S601), and after resetting a timer for measuring elapsed time, the learning unit 111 starts up the timer to start count of elapsed time (step S602). Here, on/off setting of the failure avoidance function may be performed for each laser device as is the case with the third embodiment. Alternatively, setting may be performed such that setting of the failure avoidance function of a laser device for limit characteristic test is maintained to be off and the failure avoidance function of other laser devices is set to be on, for example.

Subsequently, the learning unit 111 observes a state variable of each laser device 2 connected to the machine learning device 101 via the network 3 (step S603) and determines the on/off setting state of the failure avoidance function (step S604). Though a failure avoidance operation is not performed with respect to the laser device 2 whose setting of the failure avoidance function is determined to be off, the learning unit 111 refers to previously-obtained learning results (value functions) and determines whether or not a value of any state variable, or a point whose coordinate values are values of a plurality of any state variables of the laser device 2 has entered the failure occurrence area (step S605). When the learning unit 111 determines that a value of any state variable, or a point whose coordinate values are values of a plurality of any state variables of the laser device 2 has not entered the failure occurrence area, the learning unit 111 determines whether or not the state variable represents a state in which a failure is considered to have occurred, such as a state in which a difference between a light output command to the laser device 2 and light output obtained based on, for example, a detection result obtained by the output light sensor 7 is larger than a predetermined range and a state in which a detection result which is obtained by each sensor and is to be controlled within the predetermined control range deviates from the predetermined control range (step S606). When it is determined that a failure has not occurred, the learning unit 111 determines that a value of a variable or a point whose coordinate values are values of a plurality of any state variables has not entered the failure occurrence area and the processing proceeds to step S620 without especially setting a reward. The reason is as follows. The case where it is determined that a failure has not occurred in step S606 is a normal state in which a failure has not occurred. Though a minor plus reward may be set because the machine learning device 101 correctly recognizes the state of the laser device 2, it is highly likely that plus rewards are excessively set as a result because laser devices whose failure avoidance function is set to be off are in such a state almost all the time.

On the other hand, when it is determined that a failure has occurred in step S606, the reward calculation unit 19 sets a minus reward (reward −D) (step S607) because it is determined that a failure has occurred even though it is determined that a value of a variable, or a point whose coordinate values are values of a plurality of variables, of the laser device 2 has not entered the failure occurrence area.

Subsequently, the learning unit 111 refers to previously-obtained learning results and recorded physical models so as to estimate a quantitative failure occurrence mechanism including a sequential content from a failure cause to a failure occurrence state (step S608), and outputs the estimated quantitative failure occurrence mechanism from the decision making unit 14 (step S612). When the learning unit 111 determines that a value of a variable, or a point whose coordinate values are values of a plurality of variables, of the laser device 2 has entered the failure occurrence area in step S605, the learning unit 111 determines whether or not the state variable represents a state in which a failure is considered to have occurred as is the case with step S606 (step S609). When it is determined that a failure has occurred, the learning unit 111 determines that a value of a variable, or a point whose coordinate values are values of a plurality of variables, of the laser device 2 has entered the failure occurrence area. Thus, it is determined that a failure has occurred, and accordingly, the estimation result is correct. Therefore, the reward calculation unit 19 sets a plus reward (reward +E) (step S610) and the processing proceeds to step S608.

On the other hand, when it is determined that a failure has not occurred in step S609, the reward calculation unit 19 sets a minus reward (reward −F) (step S611) because it is determined that a failure has not occurred even though it is determined that a value of a variable, or a point whose coordinate values are values of a plurality of variables, of the laser device 2 has entered the failure occurrence area. Then, the processing proceeds to step S620.

Step S612 to step S619 in FIG. 12A are similar to step S305 to step S312 in the flowchart of FIG. 5.

A failure occurrence state confirmed by a person in charge of administration or a person in charge of repair, for example, of the laser device 2 is inputted (step S613) and the determination result acquisition unit 12 acquires the confirmed failure occurrence state as a determination result with respect to the estimated quantitative failure occurrence mechanism and outputs the determination result to the learning unit 111 (step S614). The learning unit 111 determines whether or not the failure occurrence state included in the estimated quantitative failure occurrence mechanism, that is, failed spot and component or damaged spot and component, and a state of the failure or the damage agrees with the failure occurrence state which is actually confirmed (step S615). When the failure occurrence state included in the estimated quantitative failure occurrence mechanism agrees with the failure occurrence state which is actually confirmed, the reward calculation unit 19 sets a plus reward (reward +G) (step S616) and the processing proceeds to step S620.

On the other hand, in step S615, when it is determined that the failure occurrence state included in the estimated quantitative failure occurrence mechanism has discrepancy from the failure occurrence state which is actually confirmed, the processing proceeds to step S617 and the learning unit 111 determines whether or not the confirmed failure occurrence state is inconsistent with the estimated quantitative failure occurrence mechanism. As described above, the learning unit 111 determines that for example when positions of failure occurrence spots are not matched between the confirmed failure occurrence state and the failure occurrence state included in the estimated quantitative failure occurrence mechanism and the state is not a burnout state but a melted state, the confirmed failure occurrence state is not inconsistent with a physical mechanism of failure occurrence included in the estimated quantitative failure occurrence mechanism because a failure has occurred due to temperature rise even though failure occurrence states are not matched, or that the confirmed failure occurrence state is inconsistent with the failure occurrence mechanism included in the quantitative failure occurrence mechanism, because the failure of the confirmed failure occurrence state is considered not to be a failure caused by temperature rise included in the estimated quantitative failure occurrence mechanism but to be a failure caused by mechanical breakdown due to vibration or impact (step S617). When it is determined that the confirmed failure occurrence state is not inconsistent with the physical mechanism of failure occurrence included in the estimated quantitative failure occurrence mechanism, the reward calculation unit 19 sets a relatively-small minus reward (reward −H) (step S618) because the estimated quantitative failure occurrence mechanism is partially consistent with the confirmed failure occurrence state. Then, the processing proceeds to step S620. On the other hand, when it is determined that the confirmed failure occurrence state is inconsistent with the physical mechanism of failure occurrence included in the estimated quantitative failure occurrence mechanism in step S617, the reward calculation unit 19 sets a minus reward (reward −I) whose absolute value is larger than that of the above-mentioned reward −H (step S619). Then, the processing proceeds to step S620.

Regarding the laser device 2 which is determined that the failure avoidance function thereof is set to be on in step S604, the learning unit 111 determines whether a value of any state variable, or a point whose coordinate values are values of a plurality of any state variables of the laser device 2 is close to the failure occurrence area, in which a failure occurs by any quantitative failure occurrence mechanism, more than the predetermined range (step S622). When it is determined that the value or the point is close to the failure occurrence area more than the predetermined range, the machine learning device 101 commands the laser device 2 to switch a driving condition to the failure avoidance driving condition so as to avoid a failure of the laser device 2 (step S623). After that, the learning unit 111 observes the state variable of the laser device 2 again (step S624) so as to determine whether or not the state variable represents a state in which a failure is considered to have occurred (step S625). If the learning result is accurate, it is correctly determined that a value of any state variable or a point whose coordinate values are values of a plurality of any state variables is close to the failure occurrence area, in which a failure occurs by any quantitative failure occurrence mechanism, more than the predetermined range, and the command of the failure avoidance driving condition issued with respect to the laser device 2 is appropriate, it is not considered that a failure has occurred. On the other hand, the case where it is determined that a failure has occurred represents that it is not correctly determined that a value of any state variable or a point whose coordinate values are values of a plurality of any state variables is close to the failure occurrence area, in which a failure occurs by any quantitative failure occurrence mechanism, more than the predetermined range or the issued command of the failure avoidance driving condition is not appropriate. Accordingly, the reward calculation unit 19 sets a minus reward (reward −J) (step S626). Then, the processing returns to step S608 and proceeds to the flow in which the learning unit 111 refers to learning models and physical models so as to estimate a quantitative failure occurrence mechanism. On the other hand, the case where it is determined that a failure has not occurred in step S625 represents that failure avoidance has been correctly performed, so that the reward calculation unit 19 sets a plus reward (reward +K) (step S627) and the processing proceeds to step S620.

On the other hand, when the learning unit 111 determines that a value of any state variable, or a point whose coordinate values are values of a plurality of any state variables, of the laser device 2 is not close to the failure occurrence area, in which a failure occurs by any quantitative failure occurrence mechanism, more than the predetermined range in step S622, the learning unit 111 observes state variable of the laser device 2 again (step S628) so as to determine whether or not the state variable represents a state in which a failure is considered to have occurred (step S629). If the learning result is accurate and it is correctly determined that a value of any state variable, or a point whose coordinate values are values of a plurality of any state variables, of the laser device 2 is not close to the failure occurrence area, in which a failure occurs by any quantitative failure occurrence mechanism, more than the predetermined range, it is not considered that a failure has occurred. On the other hand, it is determined that a failure has occurred, the reward calculation unit 19 sets a minus reward (reward −L) (step S630). Then, the processing returns to step S608 and proceeds to the flow in which the learning unit 111 refers to learning models and physical models so as to estimate a quantitative failure occurrence mechanism.

When it is determined that a failure has not occurred in step S629, it is determined that a value of a state variable or a point whose coordinate values are values of a plurality of state variables is not close to the failure occurrence area, in which a failure occurs by any quantitative failure occurrence mechanism, more than the predetermined range. This is a normal state in which a failure has not occurred. Though a minor plus reward may be set because the machine learning device 101 correctly recognizes the state of the laser device 2 in this case, it is highly likely that plus rewards are excessively set as a result because laser devices whose failure avoidance function is set to be on are in such a state almost all the time. Accordingly, a reward is not especially set and the processing proceeds to step S620 in the present embodiment.

As described above, all of the above-described flows related to reward setting join step S620, and whether or not there is a reward set in the reward calculation unit 19 (precisely, a reward which is newly set after update of the value function) is determined in step S620. When it is determined that there is a, least one set reward, the value function update unit 20 updates the value function depending on the set reward (step S621). Then, the learning unit 111 determines whether or not the time set by the timer, which has started timing in step S602 and is used for measuring elapsed time, has exceeded preliminarily-set time (step S631).

When it is determined that the time set by the timer has not exceeded the preliminarily-set time, the learning unit 111 determines whether or not a command for ending the machine learning has been issued (step S632). When the command for ending the learning has been issued, the learning unit 111 ends the learning. When the command for ending the learning has not been issued, the processing returns to step S603 and the learning unit 111 continues the observation of the state variable of the laser device 2.

When it is determined that the time set by the timer has exceeded the preliminarily-set time in step S631, the processing returns to step S601 and the learning unit 111 confirms whether the failure avoidance function is set to be on or off and after resetting the timer, the learning unit 111 newly restarts count of elapsed time by the timer (step S602). Elapsed time is thus measured by the timer so as to regularly check whether or not an on/off setting state of the failure avoidance function is changed, as described above.

The processing returns to step S608 and proceeds to the flow in which the learning unit 111 refers to learning models and physical models so as to estimate a quantitative failure occurrence mechanism after setting rewards in step S607, step S610, step S626, and step S630, and then, reward +G, reward −H, or reward −I is to be further set. In this case, when reward −D is previously set and reward +G is subsequently set, for example, it may be considered that reward (−D+G) which is the sum of reward −D and reward +G is set and the value function update unit 20 may update the value function depending on the reward (−D+G) in step S621. Here, D to L are assumed to have positive values and magnitudes of respective rewards may have the following relation as well as the relation I>H mentioned above.

First, D and F are related to a matter of positional accuracy of a boundary between the failure occurrence area and the outside of the failure occurrence area. It is preferable to set a larger minus reward as a value of any state variable related to a failure or a point whose coordinate values are values of a plurality of any state variables related to a failure, which is used for the determination in step S605, is farther from this boundary. In an opposite manner, regarding E, a larger plus reward may be set as a value of any state variable related to a failure or a point whose coordinate values are values of a plurality of any state variables related to a failure, which is used for the determination in step S605, is closer to this boundary. It is difficult to maximize reward unless the magnitude of G is larger than the magnitude of minus rewards H and I to some degree, so that it is considered preferable that G is set as approximately (H+I)≤G≤3(H+I). Regarding J, a failure avoidance driving condition is to be commanded when it is detected that a value of any state variable related to a failure or a point whose coordinate values are values of a plurality of any state variables related to a failure is close to the failure occurrence area more than the predetermined range, but a failure has occurred. Though the failure avoidance driving condition may be inappropriate, the failure has occurred on a position of a value of a state variable or a point whose coordinate values are values of a plurality of any state variables, which is estimated to be on the safer side from the above-mentioned boundary between the failure occurrence area and the outside of the failure occurrence area. Therefore, J may be set to be larger than D and F in normal cases. On the other hand, L is a minus reward corresponding to the result that a failure has occurred before it is detected that a value of any state variable related to a failure or a point whose coordinate values are values of a plurality of any state variables related to a failure is close to the failure occurrence area, in which a failure occurs by any quantitative failure occurrence mechanism, more than the predetermined range. Therefore, it is preferable to set L as L>J. K is a plus reward set when a failure has been able to be properly avoided. However, setting of a very large plus reward may not be preferable so as to avoid a tendency to issue a command of a failure avoidance driving condition in a state in which a value of a state variable or a point whose coordinate values are values of a plurality of state variables is not so close to the failure occurrence area. Therefore, it is preferable to set K to be in a relation of K<G.

The machine learning device 101 repeats update of the value function through repetition of steps S601 to S632 described above, and the machine learning device 101 thus performs learning so as to be able to estimate a quantitative failure occurrence mechanism based on state variables of the laser device 2 and refers to learning results so as to issue a command of a precise failure avoidance driving condition with respect to the laser device 2 when it seems that a failure will to occur in the laser device 2. As a result, failures in the laser device can be gradually reduced and a laser device exhibiting high reliability can be realized.

Fifth Embodiment

Figure 13:
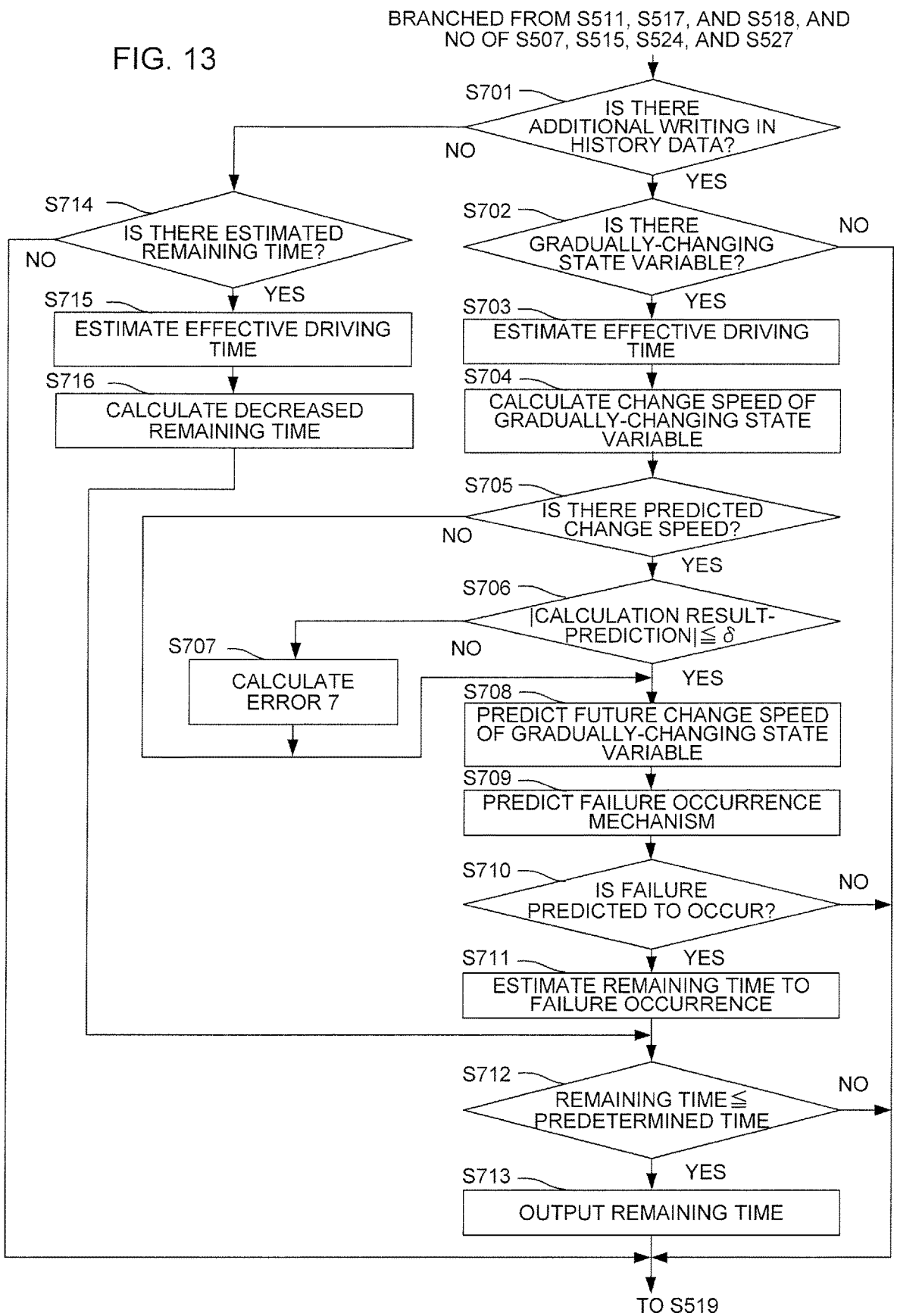
FIG. 13 is a flowchart illustrating an example of an operation of a machine learning device according to a fifth embodiment of the present invention.

FIG. 13 is a flowchart illustrating an example of an operation of a machine learning device according to a fifth embodiment of the present invention.

The machine learning device according to the present embodiment corresponds to a machine learning device obtained by adding a function as a preventive maintenance device to the machine learning device 1 illustrated in FIG. 1. That is, the machine learning device of the present embodiment commands the control unit 9 of the laser device 2 to drive the laser device 2 in a predetermined driving condition in accordance with a predetermined schedule, records a state variable, which includes light output property data of the laser device 2 obtained in every driving of the laser device 2 in the predetermined driving condition, as history data of the state variable of the laser device 2, and includes the recorded history data in a state variable observed by the state observation unit 13. Then, the machine learning device refers to quantitative failure occurrence mechanisms which correspond to respective failures and are acquired through the learning. When the machine learning device observes that a value of any state variable or a point whose coordinate values are values of a plurality of any state variables approaches a failure occurrence area, in which a failure occurs by any of the quantitative failure occurrence mechanisms, based on transition of the value of any state variable included in the history data or movement transition of the point whose coordinate values are values of a plurality of any state variables included in the history data, the machine learning device predicts time which is taken until a value of the state variable or a point whose coordinate values are the values of the state variables, which approaches the failure occurrence area, reaches the failure occurrence area when the laser device 2 is driven in a standard driving condition, that is, predicts remaining time to failure occurrence. When remaining time becomes shorter than the predetermined remaining time, the machine learning device outputs the remaining time and a quantitative failure occurrence mechanism by which a failure is predicted to occur after elapse of the remaining time.

FIG. 13 omits illustration of an operation to issue a command for driving the laser device 2 in a predetermined driving condition in accordance with a predetermined schedule and to record state variables, which include light output property data of the laser device 2 obtained in every driving of the laser device 2 in the predetermined driving condition, as history data of the state variables of the laser device 2 because this operation is simple. FIG. 13 illustrates a flowchart of only an operation to predict remaining time by using the recorded history data and output the predicted remaining time.

By insertion of the flowchart of FIG. 13 before step S519 of the flowchart in FIG. 9B, the machine learning device 1 comes to have a preventive maintenance function by which the machine learning device 1 outputs a predicted quantitative failure occurrence mechanism including information of remaining time taken until a failure occurs and information of a failed spot of a component, for example, which gradually deteriorates in property thereof and is to be failed at some stage, in addition to a preventive maintenance function by which the machine learning device 1 performs learning so as to be able to estimate a quantitative failure occurrence mechanism based on state variables of the laser device 2 and refers to learning results so as to issue a command of a precise failure avoidance driving condition with respect to the laser device 2 when it seems that a failure will occur in this laser device 2.

In the flowchart illustrated in FIG. 13, whether or not there is additional writing in history data, that is, whether or not the laser device 2 has been driven in a predetermined driving condition in accordance with a predetermined schedule and new data has been additionally written in the history data is determined (step S701). When there is additional writing in the history data, whether or not there is a state variable whose value has gradually changed when being compared with a value of a state variable of the laser device 2 which has been recorded as history data previous time or earlier even though the laser device 2 is driven in the predetermined driving condition which is the same driving condition (step S702). When there is no such a gradually-changing state variable, the processing returns to step S519 of the flowchart in FIG. 9B. On the other hand, when there is such a gradually-changing state variable, effective driving time in which the value of the gradually-changing state variable has changed is estimated (step S703). Effective driving time means driving time converted for the case of driving in a standard driving condition. For example, if it is assumed that an acceleration coefficient is the m-th power of n when laser output is n times as large as that in the standard driving condition, actual driving time×n$^m$ is the effective driving time. As described later, this acceleration coefficient can be set as a learning object of machine learning as well.

When effective driving time is thus estimated, variation of the value of the gradually-changing state variable is divided by the estimated effective driving time so as to calculate a change speed of the value of the gradually-changing state variable (step S704). Then, whether or not there is a prediction result previously obtained by predicting a change speed of the value of this gradually-changing state variable is determined (step S705). When there is a prediction result, magnitude of a difference between the previously-obtained prediction result and the change speed calculated this time is determined (step S706). When the difference is large (when the difference is larger than δ in the present embodiment), it is considered that this is because there is an error in the above-mentioned acceleration coefficient or the like, and the error calculation unit 16 therefore calculates an error 7 (step S707). The learning unit 11 predicts a future change speed of the value of this gradually-changing state variable, that is, how the value of the gradually-changing state variable or a coordinate on a point whose coordinate value is the value of the gradually-changing state variable changes (step S708). The learning unit 11 refers to previous learning results including information, for example, on failure occurrence areas as illustrated in FIG. 10 and FIG. 11 and predicts a failure occurrence mechanism by which a failure is predicted to occur when the value of the gradually-changing state variable or a coordinate on a point whose coordinate value is the value of the gradually-changing state variable changes as predicted (step S709) so as to determine whether or not a failure is predicted to occur (step S710).

When it is determined that a failure is not predicted to occur, the processing returns to step S519. When it is determined that a failure is predicted to occur at some stage, the learning unit 11 refers to the information on the failure occurrence area and so on as those illustrated in FIG. 10 and FIG. 11 and the future change state of the value of the gradually-changing state variable or the coordinate on the point whose coordinate value is the value of the gradually-changing state variable to be predicted so as to estimate remaining time to failure occurrence in driving of the laser device 2 driven in a standard driving condition (step S711) and determine whether or not the estimated remaining time is shorter than predetermined time (step S712). When the estimated remaining time is longer than the predetermined time, the processing returns to step S519. When the estimated remaining time is shorter than the predetermined time, the learning unit 11 outputs the information on the estimated remaining time to failure occurrence and on predicted failure occurrence spot included in the predicted failure occurrence mechanism (step S713) and the processing returns to step S519.

When it is determined that there is no prediction result for a change speed of the value of the gradually-changing state variable yet in step S705, the processing goes from step S705 to step S708. Further, when it is determined that there is no additional writing in the history data in step S701, whether or not there is an estimation result for remaining time to failure occurrence (step S714). When there is no estimation result for remaining time, the processing returns to step S519. When there is an estimation result for remaining time, the learning unit 11 estimates effective driving time from the time point of previous estimation for remaining time as is the case with the above-described step S703 (step S715), subtracts the effective driving time from the previously-estimated remaining time so as to calculate remaining time which is estimated a$_t$ that point (step S716), and determines whether or not the newly-estimated remaining time is shorter than the predetermined time in step S712. Accordingly, the problem that remaining time is largely lowered from predetermined time before additional writing is performed to history data and timing for outputting remaining time is accordingly delayed can be avoided.

The above-described machine learning devices according to the third embodiment and the fourth embodiment have a function for issuing a command of a failure avoidance driving condition so as to avoid a failure for state variables whose values suddenly change. On the other hand, the machine learning device according to the present embodiment has a preventive maintenance function for the case where a value of a state variable temporally slowly changes to approach a failure occurrence area as a failure due to wear. In this case, information on time to failure occurrence and information on a spot on which a failure is considered to occur are more important than failure avoidance. If time and a spot on which a failure is predicted to occur are known in advance, preparation for securing stocks of components and units, which are to need to be exchanged, and budgeting these components and units, for example, can be performed, being able to minimize a shutdown period of a laser device for maintenance and repair.

Sixth Embodiment

Figure 14:
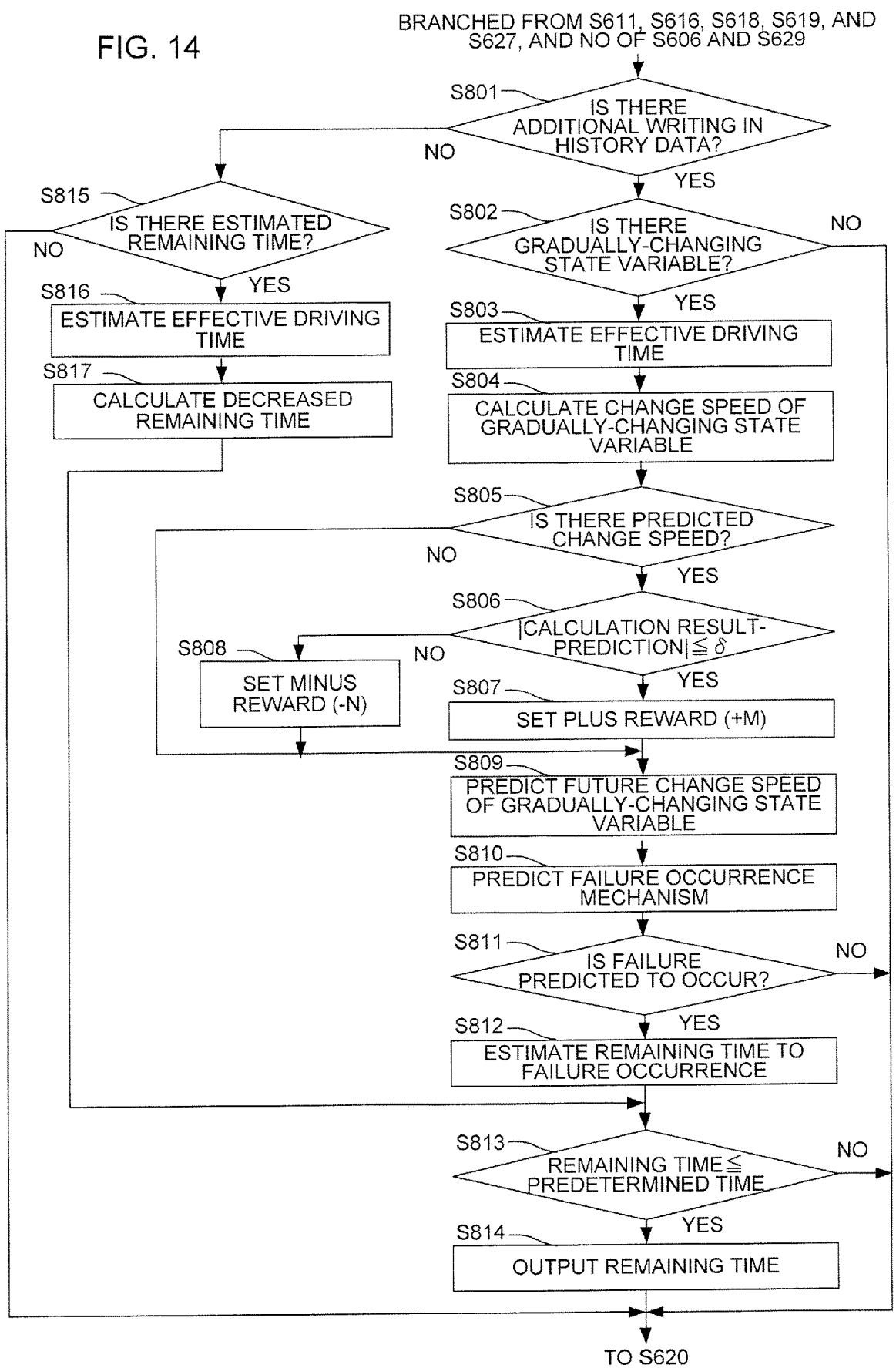
FIG. 14 is a flowchart illustrating an example of an operation of a machine learning device according to a sixth embodiment of the present invention.

FIG. 14 is a flowchart illustrating an example of an operation of a machine learning device according to a sixth embodiment of the present invention.

The machine learning device according to the present embodiment corresponds to a machine learning device obtained by providing a preventive maintenance device to the machine learning device 101 illustrated in FIG. 4. The machine learning device 101 of the present embodiment provided with the preventive maintenance device commands the control unit 9 of the laser device 2 to drive the laser device 2 in a predetermined driving condition in accordance with a predetermined schedule, records state variables, which include light output property data of the laser device 2 obtained in every driving of the laser device 2 in the predetermined driving condition, as history data of the state variables of the laser device 2, and includes the recorded history data in state variables observed by the state observation unit 13. Then, the machine learning device 101 refers to quantitative failure occurrence mechanisms which correspond to respective failures and are acquired through the learning. When the machine learning device 101 observes that a value of any state variable or a point whose coordinate values are values of a plurality of any state variables approaches a failure occurrence area, in which a failure occurs by any of the quantitative failure occurrence mechanisms, based on transition of the value of any state variable included in the history data or movement transition of the point whose coordinate values are values of a plurality of any state variables included in the history data, the machine learning device 101 predicts time which is taken until the value of the state variable or the point whose coordinate values are the values of the state variables, which approaches the failure occurrence area, reaches the failure occurrence area when the laser device 2 is driven in a standard driving condition; that is, the machine learning device 101 predicts remaining time to failure occurrence. When remaining time becomes shorter than the predetermined remaining time, the machine learning device 101 outputs remaining time and a quantitative failure occurrence mechanism by which a failure is predicted to occur after elapse of the remaining time.

FIG. 14 illustrates a flowchart of only an operation to predict remaining time by using the recorded history data and output the predicted remaining time, as is the case with FIG. 13. By insertion of the flowchart of FIG. 14 before step S620 of the flowchart in FIG. 12B, the machine learning device 101 comes to have a preventive maintenance function by which the machine learning device 101 outputs a predicted quantitative failure occurrence mechanism including information of remaining time taken until a failure occurs and information of a failed spot of a component, for example, which gradually deteriorates in property thereof and is to be failed at some stage, in addition to a preventive maintenance function by which the machine learning device 101 performs learning so as to be able to estimate a quantitative failure occurrence mechanism based on state variables of the laser device 2 and refers to learning results so as to issue a command of a precise failure avoidance driving condition with respect to the laser device 2 when it seems that a failure will occur in this laser device 2.

Description of the operation in the flowchart in FIG. 14 is omitted because the difference of FIG. 14 from FIG. 13 is only the following: the error calculation unit 16 calculates the error 7 when a difference between a calculation result of a change speed of a gradually-changing state variable and a previously-predicted result of the same is large in FIG. 13, while a plus reward (+M) is set when a difference between a calculation result of a change speed of a gradually-changing state variable and a previously-predicted result of the same is small (when the difference is equal to or smaller than δ in the present embodiment) and a minus reward (−N) is set when the difference is large (when the difference is larger than δ in the present embodiment) in FIG. 14.

The machine learning devices of the fifth embodiment and the present embodiment drive the laser device in a predetermined driving condition in accordance with a predetermined schedule, record state variables, which include light output property data of the laser device obtained in every driving of the laser device in the predetermined driving condition, as history data of the state variables of the laser device, and includes the recorded history data of the state variables of the laser device in state variables observed by the state observation unit. State variables of the laser device in driving of the laser device in the same driving condition are regularly recorded as described above, providing an advantageous point that transition of state variables of the laser device can be grasped and used for learning of a quantitative failure occurrence mechanism for a failure caused by wear and the like.

Meanwhile, in the case where a state variable of a laser device is not known or may be changed from previous driving, specifically, in the case where the laser device is newly connected to a network, the case where an installation place of the laser device is changed, the case where the laser device is not driven for a longer period of time than a predetermined pausing period, the case where components of the laser device are exchanged, or the case where components of the laser device are adjusted, for example, an unpredicted failure may occur when the laser device is suddenly driven in the above-mentioned predetermined driving condition or standard driving condition. Therefore, it is preferable that driving in a predetermined low-load driving condition is commanded before driving the laser device in the standard driving condition or a high-load driving condition, state variables in the driving in the low-load driving condition are observed by the state observation unit, quantitative failure occurrence mechanisms which correspond to respective failures and are acquired through learning are referred to, and a quantitative failure occurrence mechanism by which a failure is predicted to occur is outputted when a failure is predicted to occur if the laser device is driven in the standard driving condition or the high-load driving condition.

Accordingly, it becomes possible to prevent an instant occurrence of a failure, such as an occurrence of a failure caused by reflection light from a protection window, which is contaminated in long term pausing, of a machining head, and an occurrence of a failure occurring when unintended spots are irradiated with laser output light and reflection light due to insufficient optical axis adjustment. When determination cannot be performed only by low-load driving, driving in a driving condition with a slightly-higher load may be tested.

Seventh Embodiment

FIG. 15 illustrates an example of a list outputted by a machine learning device according to a seventh embodiment of the present invention. The list describes a quantitative failure occurrence mechanism which corresponds to each failure in the laser device and is acquired through learning, occurrence frequency of a failure corresponding to each quantitative failure occurrence mechanism, and items which are preferable to be improved so as to lower occurrence frequency of a failure in a laser device. If quantitative failure occurrence mechanisms corresponding to respective failures among various failures are acquired through learning, effective improvement for lowering failure occurrence frequency becomes clear. Output of the information of the improvement provides effective knowledge for improving reliability of a laser device, enabling development of a long-life laser device exhibiting high reliability. It is considered that only an outline of a failure occurrence mechanism is displayed in a list. Therefore, a link may be set in the outline of the failure occurrence mechanism so that details of the quantitative failure occurrence mechanism including quantitative values as well are displayed when the link is selected. A score and a priority order may be added to each improvement item. Further, a list may include items such as average repair cost and average repair time as well so as to clear necessity of improvement.

Eighth Embodiment

Figure 16:
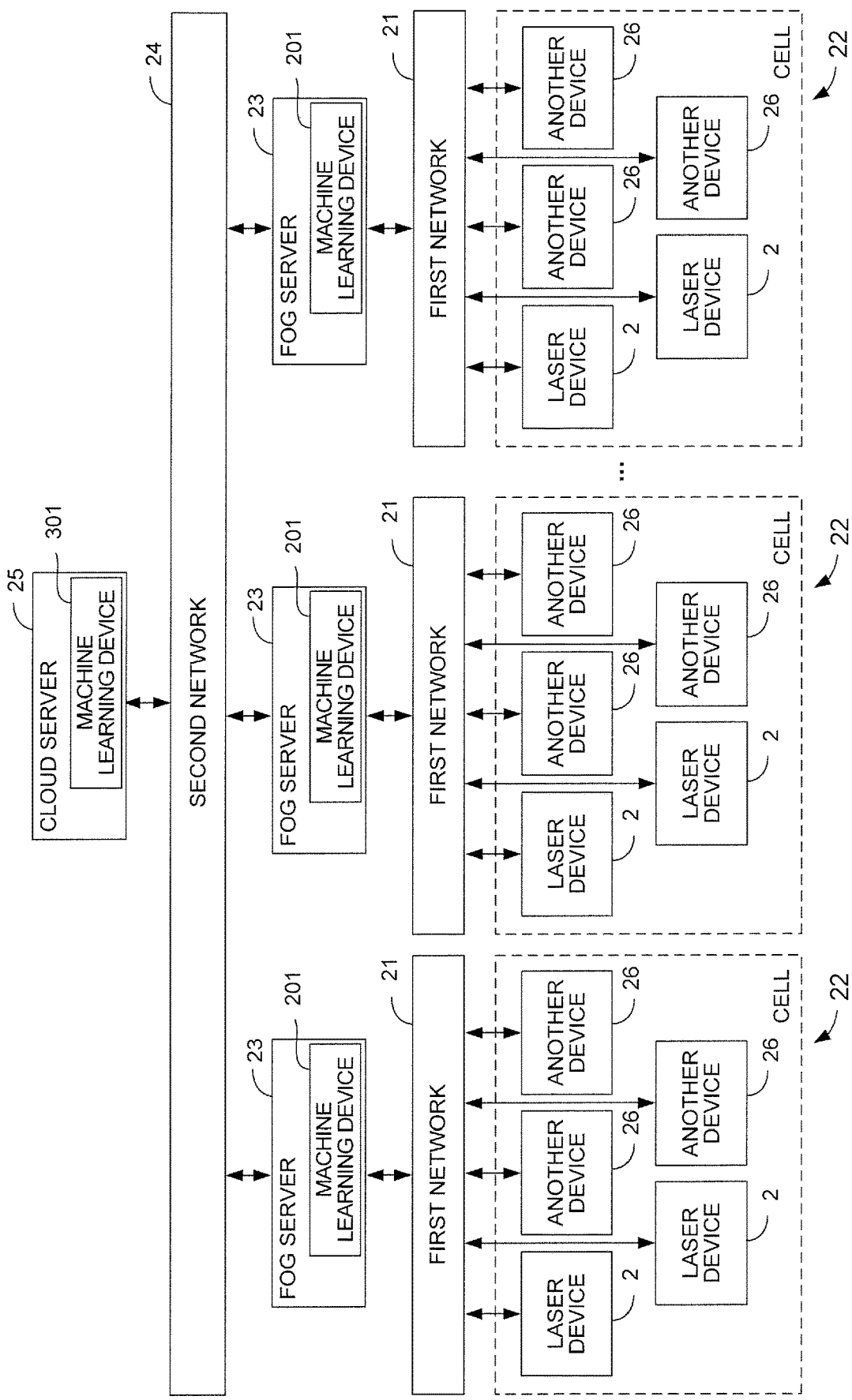
FIG. 16 is a block diagram illustrating an example of a position of a machine learning device according to an eighth embodiment of the present invention on a network and a connection state of the same to the network.

FIG. 16 is a block diagram illustrating an example of a position of a machine learning device according to an eighth embodiment of the present invention on a network and a connection state to the network. A machine learning device 201, which is the machine learning device according to any of the first embodiment to the seventh embodiment, exists on a fog server 23, which controls at least one cell 22 including a plurality of devices including at least one laser device via a first network 21. By making the machine learning device 201 exist on the fog server 23 for controlling a relatively small scale cell, observation of state variables of the laser device 2 and exchange of information whose real time property is important such as a command of a failure avoidance driving condition can be performed without delay.

Further, a machine learning device 301, which is the machine learning device according to any of the first embodiment to the seventh embodiment, is made exist on a cloud server 25 which controls, via the second network 24, at least one fog server 23, which controls at least one cell 22 including a plurality of devices 26 including at least one laser device 2 via the first network 21. By making at least one of the machine learning device 301 exist on the cloud server 25 which has large scale recording capacity and is capable of performing large scale signal processing in high speed, it becomes possible to perform signal processing and calculation in machine learning based on a neural network or the like in high speed.

Further, as illustrated in FIG. 16, it is preferable that a plurality of machine learning devices 201 and 301 exist and results of machine learning are mutually exchanged or shared among the plurality of machine learning devices. It tends to take longer time to advance learning because a failure does not occur so often. However, learning progress speed can be increased by exchanging or sharing learning results. Further, accuracy in learning is also enhanced.

The embodiments of the present invention have been described thus far. However, the present invention is not limited to the examples of the above-described embodiments and may be embodied in various aspects by adding appropriate alterations.

The invention claimed is:

1. A machine learning device that is connected with at least one laser device to be mutually communicable with the laser device via a network, the laser device comprising:
   at least one laser oscillator;
   a power source unit that supplies driving current to the laser oscillator;
   at least one output light sensor that detects light output of laser light emitted from the laser oscillator; and
   a control unit that outputs at least a current output command corresponding to a light output command to the power source unit and receives a detection signal from the output light sensor, wherein
   the machine learning device comprises:
      a state observation unit that observes a state variable of an inside and an outside of the laser device, the state variable including time-series data of light output which is detected by the output light sensor and the light output command, through the control unit of the laser unit;
      a determination result acquisition unit that acquires a determination result on correctness with respect to a quantitative failure occurrence mechanism, the quantitative failure occurrence mechanism being outputted by the machine learning device for each failure in the laser device;
      a learning unit that receives output from the state observation unit and output from the determination result acquisition unit and learns the quantitative failure occurrence mechanism corresponding to the each failure while associating the quantitative failure occurrence mechanism with the state variable of the laser device, the state variable being observed by the state observation unit, and the determination result on correctness with respect to the quantitative failure occurrence mechanism, the determination result being acquired by the determination result acquisition unit; and
      a decision making unit that refers to a learning result of the learning unit when an occurrence of the each failure is detected through at least collation between the time-series data of the light output and the light output command and decides the quantitative failure occurrence mechanism which is to be outputted from the machine learning device.

2. The machine learning device according to claim 1, wherein
   the state variable of the laser device, the state variable being observed by the state observation unit, includes at least one of
      a hardware configuration including a machining head of the laser device,
      manufacturing information of the laser device or a unit and a component constituting the laser device, output data which represents a driving condition or a driving state of the laser device and is outputted from a sensor installed on the inside or the outside of the laser device,
a history of the driving condition or the driving state,
a repair history of the laser device,
internal data of control software for controlling the laser device, and
calculation data obtained based on the output data or the internal data, and wherein
the output data includes at least one of light output from the laser device or the laser oscillator, intensity of reflection light which propagates inside a laser optical system including an optical fiber in an opposite direction to that of laser output light, driving current or driving power of a laser diode module which is an excitation light source of the laser oscillator, a temperature of the laser diode module or a part which is thermally connected with the laser diode module, a temperature of a heat sink for suppressing temperature rise of the laser diode module, a kind, a property, a temperature, a flow rate, and pressure of refrigerant for cooling down the heat sink, intensity of vibration, acceleration, and intensity of impact which are applied to the laser device, and a temperature, humidity, cleanness, oil mist concentration, and floating particle concentration of ambient air of the laser device.

3. The machine learning device according to claim 1, wherein the machine learning device
records at least one physical model, the physical model representing at least a part of a quantitative failure occurrence mechanism, the quantitative failure occurrence mechanism corresponding to each failure in the laser device and including a chain of physical causal relationships including a failure cause triggering failure occurrence and a level of the failure cause, a value or variation of a specific state variable in the state variable of the laser device, the value or variation being brought by the failure cause, a physical phenomenon or a physical mechanism in which a damage is generated with the value or the variation of the specific state variable, and a failure state representing a spot or a component which is damaged in the physical phenomenon or the physical mechanism and a state and a level of the damage, and
performs at least one of estimation of the quantitative failure occurrence mechanism corresponding to the each failure and learning of the quantitative failure occurrence mechanism corresponding to the each failure by referring to the physical model.

4. The machine learning device according to claim 3, wherein determination of correctness of the quantitative failure occurrence mechanism outputted with respect to the each failure in the laser device is performed based on presence of at least one accordance between presence of agreement between a failure occurrence state which is confirmed by an administrator, an operator, or a person in charge of repair of the laser device and a failure occurrence state included in the quantitative failure occurrence mechanism which is outputted, and presence of consistency, which is examined by referring to the physical model, between the confirmed failure occurrence state and the physical phenomenon or the physical mechanism which is included in the quantitative failure occurrence mechanism which is outputted.

5. The machine learning device according to claim 4, wherein
the learning unit
has at least one learning model to which a learning result is reflected, and
includes an error calculation unit and a learning model update unit, and wherein
when there is a difference between the failure occurrence state which is confirmed and the failure occurrence state which is included in the outputted quantitative failure occurrence mechanism, the learning unit calculates a first error depending on a magnitude of the difference and updates the learning model depending on the first error in the learning model update unit,
when the failure occurrence state which is confirmed is inconsistent with the physical phenomenon or the physical mechanism included in the outputted quantitative failure occurrence mechanism in collation with the physical model, the learning unit calculates a second error while considering that an error larger than the first error is generated, and
the learning model update unit updates the learning model depending on the magnitude of the first or second error.

6. The machine learning device according to claim 4, wherein
the learning unit
has at least one value function to which a learning result is reflected, and
includes a reward calculation unit and a value function update unit, and wherein
when the failure occurrence state which is confirmed agrees with the failure occurrence state which is included in the outputted quantitative failure occurrence mechanism, the reward calculation unit sets a plus reward,
when there is a difference between the failure occurrence state which is confirmed and the failure occurrence state which is included in the outputted quantitative failure occurrence mechanism, the reward calculation unit sets a first minus reward depending on a magnitude of the difference,
when the failure occurrence state which is confirmed is inconsistent with the physical phenomenon or the physical mechanism included in the quantitative failure occurrence mechanism which is estimated in collation with the physical model, the reward calculation unit sets a second minus reward which is larger than the first minus reward, and
the value function update unit updates the value function depending on the plus reward or the first or second minus reward set by the reward calculation unit.

7. The machine learning device according to claim 6, wherein
the learning unit outputs a plurality of quantitative failure occurrence mechanisms for a failure such as not only a single quantitative failure occurrence mechanism of a first candidate but also a quantitative failure occurrence mechanism of a second candidate and a quantitative failure occurrence mechanism of a third candidate via the decision making unit when the learning unit detects the failure in the laser device,
the reward calculation unit sets a reward whose absolute value is relatively larger as a candidate rank of the quantitative failure occurrence mechanism is higher, and the reward calculation unit sets a reward whose absolute value is relatively smaller as the candidate rank of the quantitative failure occurrence mechanism is lower, when the reward calculation unit sets a plus or minus reward with respect to the quantitative failure occurrence mechanism of each candidate, and the value function update unit updates the value function depending on the reward set by the reward calculation unit.

8. The machine learning device according to claim 1, wherein the machine learning device also has a function as a preventive maintenance device by referring to the quantitative failure occurrence mechanism which corresponds to each failure and which is acquired through learning, and when a value of any state variable of, or a point whose coordinate values are values of a plurality of any state variables of, the laser device which is connected to be mutually communicable via the network is close to a failure occurrence area, in which a failure occurs by any quantitative failure occurrence mechanism, more than a predetermined range, issuing a command of a failure avoidance driving condition, the failure avoidance driving condition being a driving condition for preventing an occurrence of a failure, to the control unit of the laser device.

9. The machine learning device according to claim 8, wherein the machine learning device commands the control unit of the laser device to drive the laser device in a predetermined driving condition in accordance with a predetermined schedule, records the state variable, the state variable including light output property data of the laser device obtained in every driving of the laser device in the predetermined driving condition, as history data of the state variable of the laser device, and includes the history data, the history data being recorded, in a state variable observed by the state observation unit.

10. The machine learning device according to claim 9, wherein the machine learning device has also a function as a preventive maintenance device by referring to the quantitative failure occurrence mechanism which corresponds to each failure and is acquired through learning, when observing that a value of any state variable or a point whose coordinate values are values of a plurality of any state variables approaches the failure occurrence area, in which a failure occurs by any quantitative failure occurrence mechanism, based on transition of the value of any state variable or movement transition of the point whose coordinate values are values of a plurality of any state variables, included in the history data, predicting time which is taken until the value of the state variable or the point whose coordinate values are the values of the state variables, which approaches the failure occurrence area, reaches the failure occurrence area when the laser device is driven in a standard driving condition, that is, remaining time to failure occurrence, and when the remaining time becomes shorter than predetermined time, outputting at least one of the remaining time and the quantitative failure occurrence mechanism by which a failure is predicted to occur after elapse of the remaining time.

11. The machine learning device according to claim 1, wherein in the case where any laser device which is connected to be mutually communicable via the network is in any state of a state in which the laser device is newly connected to the network, a state in which an installation place of the laser device is changed, a state in which the laser device has not been driven for a longer period of time than a predetermined pausing period, a state in which components of the laser device are exchanged, and a state in which components of the laser device are adjusted, and a state variable of the laser device is not known or has a possibility of having changed from previous driving, the control unit of this laser device is commanded to drive the laser device in a predetermined low-load driving condition before driving the laser device in a standard driving condition or a high-load driving condition, and a state variable obtained in the driving in the low-load driving condition is observed through the state observation unit, the quantitative failure occurrence mechanism which corresponds to each failure and is acquired through learning is referred to, and a quantitative failure occurrence mechanism by which a failure is predicted to occur is outputted in a case where the failure is predicted to occur when the laser device is driven in the standard driving condition or the high-load driving condition.

12. The machine learning device according to claim 1, wherein the machine learning device has a function by referring to a quantitative failure occurrence mechanism, the quantitative failure occurrence mechanism corresponding to each failure and being acquired through learning, and occurrence frequency of a failure corresponding to each quantitative failure occurrence mechanism and outputting a list of an item which is preferable to be improved so as to lower occurrence frequency of a failure in the laser device.

13. The machine learning device according to claim 1, wherein the machine learning device exists on a fog server, the fog server controlling at least one cell including a plurality of devices including at least one laser device via a first network.

14. The machine learning device according to claim 13, wherein the machine learning device exists on a cloud server, the cloud server controlling at least one fog server via the second network, the fog server controlling at least one cell including a plurality of devices including at least one laser device via the first network.

15. The machine learning device according to claim 1, wherein a plurality of machine learning devices exist and the plurality of machine learning devices mutually exchange or share a result of machine learning thereamong.

\* \* \* \* \*